(12) United States Patent  
Scherff et al.

(10) Patent No.: US 7,943,416 B2
(45) Date of Patent: May 17, 2011

(54) LOCAL HETEROSTRUCTURE CONTACTS

(75) Inventors: Maximilian Scherff, Hagen (DE); Wolfgang Rainer Fahrner, Hagen (DE)

(73) Assignee: Q-Cells SE, Bitterfeld-Wolfen (DE)

( * ) Notice: Subject to any disclaimer, the term of this patent is extended or adjusted under 35 U.S.C. 154(b) by 59 days.

(21) Appl. No.: 12/310,666

(22) PCT Filed: Aug. 28, 2007

(86) PCT No.: PCT/DE2007/001532
§ 371 (c)(1),
(2), (4) Date: May 4, 2009

(87) PCT Pub. No.: WO2008/040273
PCT Pub. Date: Apr. 10, 2008

(65) Prior Publication Data
US 2009/0317934 A1 Dec. 24, 2009

(30) Foreign Application Priority Data
Sep. 5, 2006 (DE) .................... 10 2006 042 617

(51) Int. Cl.
H01L 21/00 (2006.01)
H01L 21/44 (2006.01)
H01L 21/302 (2006.01)
H01L 21/461 (2006.01)

(52) U.S. Cl. ............. 438/94; 438/57; 438/72; 438/609; 438/710; 977/755; 257/E21.218; 257/E21.407; 257/E21.585

(58) Field of Classification Search .............. 438/72, 438/94, 609, 710, 407; 257/E21.218, E21.407, 257/E21.585
See application file for complete search history.

(56) References Cited

U.S. PATENT DOCUMENTS

| 4,799,968 A | 1/1989 | Watanabe et al. |
| 5,026,660 A | 6/1991 | Dutt et al. |
| 5,066,340 A | 11/1991 | Iwamoto et al. |
| 5,114,498 A | 5/1992 | Okamoto et al. |
| 5,152,833 A | 10/1992 | Iwamoto et al. |

(Continued)

FOREIGN PATENT DOCUMENTS
DE 37 32 617 4/1988
(Continued)

OTHER PUBLICATIONS
International Search Report.
(Continued)

Primary Examiner — Alexander G Ghyka
Assistant Examiner — Seahvosh J Nikmanesh
(74) Attorney, Agent, or Firm — Collard & Roe, P.C.

(57) ABSTRACT

Disclosed is a novel method for creating local contacts in solar cells. In the method, a surface passivation that has been applied to a semiconductor substrate is locally etched away using a plasma process with the help of a thin stretched, elastic foil. If necessary, deep doping gradients are then locally created at the same points by means of a hydrogen plasma treatment with the help of thermal donors so as to increase the diffusion length of the charge carriers in the direction of the contacts. Finally, local heterostructure contacts are applied through the same mask openings. The contacts are characterized by a much lower saturation current than common diffused contacts and are therefore particularly suitable for high-performance solar cells.

20 Claims, 16 Drawing Sheets

U.S. PATENT DOCUMENTS

| | | | |
|---|---|---|---|
| 5,213,628 | A | 5/1993 | Noguchi et al. |
| 5,646,069 | A * | 7/1997 | Jelloian et al. ............ 438/605 |
| 5,705,828 | A | 1/1998 | Noguchi et al. |
| 6,423,567 | B1 | 7/2002 | Lüdemann et al. |
| 6,670,542 | B2 | 12/2003 | Sakata et al. |
| 6,878,921 | B2 | 4/2005 | Taguchi et al. |
| 7,164,150 | B2 | 1/2007 | Terakawa et al. |
| 7,388,147 | B2 | 6/2008 | Mulligan et al. |
| 2001/0008295 | A1 | 7/2001 | Sakata et al. |
| 2003/0168578 | A1 | 9/2003 | Taguchi et al. |
| 2003/0168660 | A1 | 9/2003 | Terakawa et al. |
| 2005/0191572 | A1 | 9/2005 | Baude et al. |
| 2006/0081876 | A1* | 4/2006 | Monfray et al. ............ 257/192 |
| 2009/0052487 | A1* | 2/2009 | Yamamoto et al. ...... 372/45.011 |

FOREIGN PATENT DOCUMENTS

| | | |
|---|---|---|
| DE | 40 10 302 | 10/1990 |
| DE | 40 25 311 | 2/1991 |
| DE | 40 27 236 | 3/1991 |
| DE | 198 19 200 | 11/1999 |
| DE | 11 2004 000 600 | 2/2006 |
| DE | 10 2004 061 604 | 6/2006 |
| EP | 0 051 396 | 5/1982 |
| EP | 1 113 505 | 7/2001 |
| EP | 1 187 223 | 3/2002 |
| EP | 1 300 889 | 4/2003 |
| EP | 1 320 134 | 6/2003 |
| JP | 2001-189427 | 7/2001 |
| JP | 2003-258287 | 9/2003 |
| JP | 2003-324209 | 11/2003 |
| WO | WO 88/03709 | 5/1988 |

OTHER PUBLICATIONS

English translation of the International Preliminary Report on Patentability and Written Opinion of the International Searching Authority.

[Breitenstein06] O. Breitenstein, P. Altermatt, K. Ramspeck, Ma Green, Jianhua Zhao and A. Schenk, Interpretation of the Commonly Observed I-V Characteristics of c-Si Cells Having Ideality Factor Larger than Two, Proc. 4th WCPEC, Hawaii, 879-884, (2006). (Spec, pp. 11 and 44).

[Dauwe02] S. Dauwe, L. Mittelstädt, A. Metz, and R. Hetzei, Experimental Evidence of Parasitic Shunting in Silicon Nitride Rear Surface Passivated Solar cells, Prog. Photovolt: Res. Appl., 10, 271-278, (2002). (Spec, p. 20 and 44).

[Farrokh-B.06] M. Farrokh Baroughi and S. Sivoththaman, A Novel Si-based Heterojunction Solar Cell without Transparent Conductive Oxide, Proc. 4th WCPEC, Hawaii, 83-86, (2006). (Spec, pp. 22, 30, 44).

[Goetzberger03] A Goetzberger, C. Hebling and H.-W Schock, Photovoltaic materials, history, status and outlook, Mater. Sci. Eng. R 40, 1-46, (2003). (Spec, pp. 1 and 45).

[Glunz02] S. W. Glunz et al., High-Efficiency Silicon Solar Cells for Low-Illumination Applications, Proc. 29th PVSC, New Orleans, 450-453, (2002). (Spec, pp. 21 and 45).

[Glunz04] S. Glunz, E. Schneiderlöchner, D. Kray, A. Grohe, M. Hermle, H. Kampwerth, R. Preu and G. Willeke, Laser-Fired Contact Silicon Solar Cells on p- and n-Substrates, Proc. 19th Europ. PVSEC, Paris, pp. 408-417 (2004). (Spec, pp. 2 and 45).

[Glunz06] S. W Glunz, S. Janz, M. Hofmann, T. Roth and G. Willeke, Surface Passivation of Silicon Solar Cells using Amorphous Silicon Carbide Layers, Proc. 4th WCPEC, Hawaii, 1016-1019, (2006). (Spec, pp. 14, 39 and 45).

[Green98] M. Green, J. Zhao, A Wang, 23% Module and other Silicon Solar Cell Advances, Proc. 2nd WCPEC, Wien, 1187-1192, (1998). (Spec, pp. 1, 10, 35 and 45).

[Heintze06] M. Heintze, A. Hauser, R. Möller, H. Wanka, E. López, I. Dani, V. Hopfe, J. W. Müller, A Huwe, In-Line Plasma Etching at Atmospheric Pressure for Edge Isolation in Crystalline Si Solar Cells, Proc. 4th WCPEC, Hawaii, 1119-1121, (2006). (Spec, pp. 40 and 45).

[Huang04] Y. L. Huang, Y. Ma, R. Job, A. G. Ulyashin, Hydrogen diffusion at moderate temperatures in p-type Czochralski silicon, Journal of Applied Physics 96 (12), 7080-7086, (2004). (Spec, pp. 9, 34 and 45).

Huang05] Y. L. Huang, Y. Ma, R. Job, M. Scherff, W. R. Fahrner, H. G. Shi, D. S. Xue and M.-L. David, Silicon Pyramidal Texture Formed in Pure Hydrogen Plasma Exposure, Journal of The Electrochemical Society, 152 (9), C600-C604, (2005). (Spec, p. 45).

[Imai06] R. Imai, T. Ishiwata, H. Sai, N. Yamamoto, K. Arafune, Y. Ohshita and M. Yamaguchi, Surface Passivation of crystalline Silicon Solar Cells by Atmospheric Pressure chemical Vapor Deposition, Proc. 4th WCPEC, Hawaii, (2006). (Spec, pp. 40 and 45).

[Jansen95] H. Jansen, M. de Boer, R. Legtenberg and M. Elwenspoek, The Black Silicon Method:, J. Micromech. Microeng. (5),115-120 (1995). (Spec, pp. 12 and 46).

[Jensen02b] N. Jensen, Heterostruktursolarzellen aus amorphem und kristallinem Silicium, Dissertation, (Shaker Verlag GmbH, Aachen, 2002). (Spec, pp. 21 and 46 ).

[Jin06] H. Jin, K. J. Weber und AW Blakers, Depassivation of Si-SiO2 Interface Following Rapid Thermal Annealing, Proc. 4th WCPEC, Hawaii, 1078-1080, (2006). (Spec, p. 46).

[Jin06b] H. Jin, K. J. Weber und Aw Blakers, The Effect of a Post Oxidation In-situ Nitrogen Anneal on Si Surface Passivation, Proc. 4th WCPEC, Hawaii, 1071-1073, (2006). (Spec, p. 46).

[Job98] R. Job, W. R. Fahrner, N. M. Kazuchits, AG. Ulyashin, A Two-Step Low-Temperature Process for a p-n Junction Formation due to Hydrogen enhanced Thermal Donor Formation in p-Type Czochralski Silicon, MRS 513, 337-342, (1998). (Spec, pp. 9, 34, 42 and 46).

[Legtenberg95] R. Legtenberg, H. Jansen, M. de Boer and M. Elwenspoek, Anisotropie Reactive Ion Etching of Silicon Using $SF_6$/$O_2$/$CHF_3$ Gas Mixtures, J. Electrochem. Soc., 142, 2020-2027, (1995). (Spec, pp. 28, 42-43 and 46).

[Lim98] S.-H. Lim, J.-W Park, H.-K. Yuh and E. Yoon, Dry Cleaning of Fluorocarbon Residuals by Low-Power Electron Cyclotron Resonance Hydrogen Plasma, Journal of the Korean Physical Society, (33), pp. S108-S111, (1998). (Spec, pp. 14 and 46).

[Maruyama06] E. Maruyama, A Terakawa, M. Taguchi, Y. Yoshimine, D. Ide, T. Baba, M. Shima, H. Sakata and M. Tanaka, Sanyo's Challenges to the Development of High-efficiency HIT Solar Cells and the Expansion of HIT Business, Proc. 4th WCPEC, Hawaii, 1455-1460, (2006). (Spec, pp. 2, 5-6, 14, 18, 21 and 46).

[Matsumoto03] M. Matsumoto, M. Shima, S. Okamoto, K. Murata, M. Tanaka, S. Kiyama, H. Kakiuchi, K. Yasutake, K. Yoshii, K. Endo and Y. Mori, Extremely High-Rate Deposition of Silicon Thin Films Prepared By Atmospheric Plasma CVD Method with a Rotary Electrode, Proc. 3rd WCPEC, Osaka, 50-A3-03, (2003). (Spec, pp. 40 and 46).

Mulligan04] W. Mulligan, D. Rose, M. Cudzinovic, D. De Ceuster, K. McIntosh, D. Smith, and R. Swanson. Manufacture of Solar Cells with 21% Efficiency, Proc. 19th Europ. PVSEC, Paris, pp. 387-390, (2004). (Spec, pp. 2, 9 and 46-47).

[Plagwitz05] H. Plagwitz, M. Schaper, A. Wolf, R. Meyer, J. Schmidt, B. Terheiden and R. Brendel, 20%-Efficient silicon Solar Cells with Local Contacts to the a-Si-Passivated Surfaces by means of Annealing (COSIMA), Proc. 20th Europ. PVSEC, Barcelona, 725-728, (2005). (Spec, pp. 2 and 47).

[Sopori06] B. Sopori, R. Reedy, K. Jones, L. Gedvilas, B. Keyes, Y. Yan, M. Al-Jassim, V. Yulundur and A. Rohatgi, Damage-Layer-Mediated H Diffusion During SiN: H Processing: A Comprehensive Model, Proc. 4th WCPEC, Hawaii, 1028-1031, (2006). (Spec, p. 47).

[Scherff06] M. LD. Scherff S. Schwertheim, Y. Ma, 1. Mueller, W. R. Fahrner, 10 x 10 $cm^2$ Hit Solar Cells Contacted with Lead-Free Electrical Conductive Adhesives to Solar Cell Interconnectors, Proc. 4th WCPEC, Hawaii, 1384-1387, (2006). (Spec, pp. 10, 15, 34 and 47).

[Scherff06a] M. LD. Scherff and Y. Ma and W. Düngen. and 1. Mueller and W. R. Fahrner, Increased efficiencies in a-Si:H(n)/cz-Si(p) heterojunction solar cells due to gradient doping by thermal donors, 21th Europ. PVSEC, Dresden, 1178-1180 (2006). (Spec, p. 47).

[Scherff06b] M. LD. Scherff, H. Stiebig, S. Schwertheim and W. R. Fahrner, Double Layer Antireflexion Coating of Heterojunction Solar Cells, 21th Europ. PVSEC, Dresden, 1392-1395, (2006). (Spec, pp. 21 and 47).

[Schmidt06] M. Schmidt, H. Angermann, E. Conrad, L. Korte, A. Laades, K. v. Maydell, Ch. Schubert and R. Stangl, Physical and Technological Aspects of a-Si:H/c-Si Hetero-Junction Solar Cells, Proc. 4th WCPEC, Hawaii, 1433-1438, (2006). (Spec, pp. 30, 39 and 47).

[Schnell00] M. Schnell, R. Lüdemann and S. Schaefer, Plasma Surface Texturization for Multicrystalline Silicon Solar Cells, Proc. 28th PVSC, Ankorage, 367-370, (2000). (Spec, p. 47).

[SP-220 06] Data sheet Sunpower SPR-220 www.sunpowercorp.com (Jun. 2006). (Spec, pp. 5-6 and 47).

[Stangl01] R. Stangl, A. Froitzheim, L. Elstner and W. Fuhs, Amorphous/chrystalline silicon heterojunction solar cells, a simulation study, Proc. 17th Europ. PVSEC, München, 1387-1390, (2003). (Spec, pp. 13, 21 and 48).

[Stangl03] R. Stangl, A. Froitzheim, M. Schmidt and W. Fuhs, Design Criteria for Amorphous/Crystalline Silicon Heterojunction Solar Cells,—A Simulation Study, Proc. 3rd WCPEC, Osaka, 4P-A8-45, (2003). (Spec, pp. 13, 18 and 48).

[Swanson05] R. Swanson, Approaching the 29% Limit Efficiency of silicon Solar Cells, Proc. 31th PVSC, Colorado Springs, 889-894, (2005). (Spec, pp. 5, 6, 14, 29 and 48).

[Taguchi05] M. Taguchi, H. Sakata, Y. Yoshimine, E. Maruyama, A. Terakawa and M. Tanaka, An Approach for the higher Efficiency in the HIT Cells, Proc. 31th PVSC, Colorado Springs, 866-871, (2005). (Spec, pp. 5, 6, 14, 19 and 48).

[Tucci01] M. Tucci, R. De Rosa and F. Roca, $CF_4/O_2$ Dry Etching of Textured Crystalline Silicon Surface in a-Si:H/c-Si Heterojunction for Photovoltaic Applications, Sol. Energy Mater. Sol. Cells, 69, 175-185, (2001). (Spec, pp. 14, 39 and 48).

[Ulyashin01] A. Ulyashin, R. Job, M. Scherff, I. Khorunzhii, W. R. Fahrner,: Low-temperature drift field performance in the base region of crystalline silicon solar cells by hydrogen enhanced thermal donor formatation, 17th European PVSEC, München, 1379 (2001). (Spec, pp. 10, 34 and 48).

[van Wieringen.56] A. Van Wieringen and N. Warmholtz, Physica, 22, 849-865, (1956). (Spec, p. 48).

[Windgassen05] H. Windgassen, M. Scherff, A. Nositschka, H. Kurz and W. R. Fahrner, Large Area (n)a-Si:H/(p )c-Si Heterojunction Solar Cells with Low Temperature Screen Printed Contacts, Proc. 20th Europ. PVSEC, Barcelona, 954-957, (2005). (Spec, pp. 15, 19, 44 and 48).

[Weber97] K. J. Weber, A. Cuevas and A. W. Blakers, The Influence of Drift Fields in Thin Silicon Solar Cells, Sol. Energy Mater. Sol. Cells, 45, 151-160, (1997). (Spec, pp. 17 and 48 and cited as [Cuevas97] on pp. 10 and 35).

[Zhang00] D. Zhang, Promotionsschrift: Surface reaction Mechanisms in Plasma Etching Processes, University of Illinois at Urbana-Champaign, Urbana, Illinois, 2000. (Spec, pp. 13 and 48-49).

[Rostan05] P. J. Rostan, U. Rau, V. X. Nguyen, T. Kirchartz, M. B. Schubert, J. H. Werner, Low-temperature a-Si:H/ZnO/Al back contacts for high-efficiency silicon solar cells, Solar Energy Materials & Solar Cells, 2005, pp. 1-8. (Spec, pp. 30 and 38).

[Sawada-94] T. Baba, T. Matsuyama, T. Sawada, T. Takahama, K. Wakisaka, S. Tsuda and S. Nakano, Polycrystalline Silicon Thin-film Solar Cell Prepared by the Solid Phase Crystallization (SPC) Method, IEEE, 1994, pp. 1315-1318. (Spec, p. 6).

[Sawada-94] Toru Sawada, Norihiro Terada, Sadaji Tsuge, Toshiaki Baba, Tsuyoshi Takahama, Kenichiro Wakisaka, Shinya Tsuda and Shoichi Nakano, High-Efficiency a-Si/c-Si Heterojunction Solar Cell, IEEE, 1994, pp. 1219-1226. (Spec, p. 6).

[Salurso01] Elena Salurso, Gaetano Contento, M. L. Addonizio, Mario Tucci, Francesco Roca, Dry Surface Conditioning of Textured Crystalline Silicon in Amorphous Crystalline Silicon Heterostructure Solar Cells, Enea Portici Research Center, pp. 1-4, 2001. (Spec, p. 14).

[Hermle05] M. Hermle, E. Schneiderloechner, G Grupp, S. W. Glunz, Comprehensive Comparison of Different Rear Side Contacting Methods for High-efficiency Solar Cells, $20^{th}$ European Photovoltaic Solar Energy Conference and Exhibition, Jun. 2005, Barcelona, pp. 1-4. (Spec, p. 21).

* cited by examiner

Figure: 1
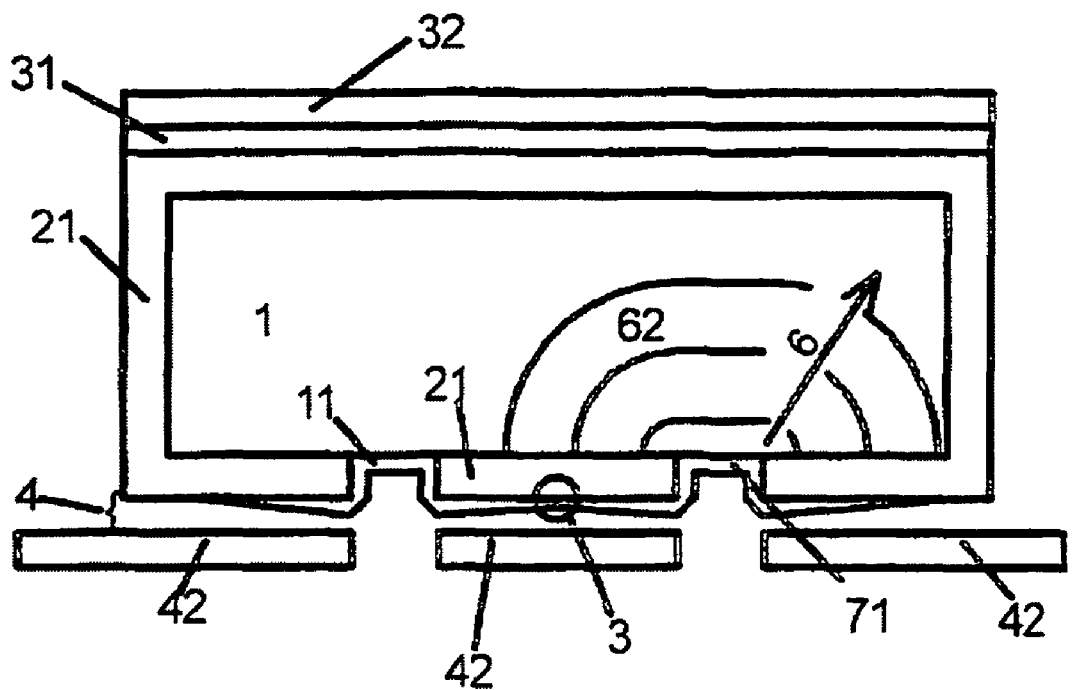
Figure: 2
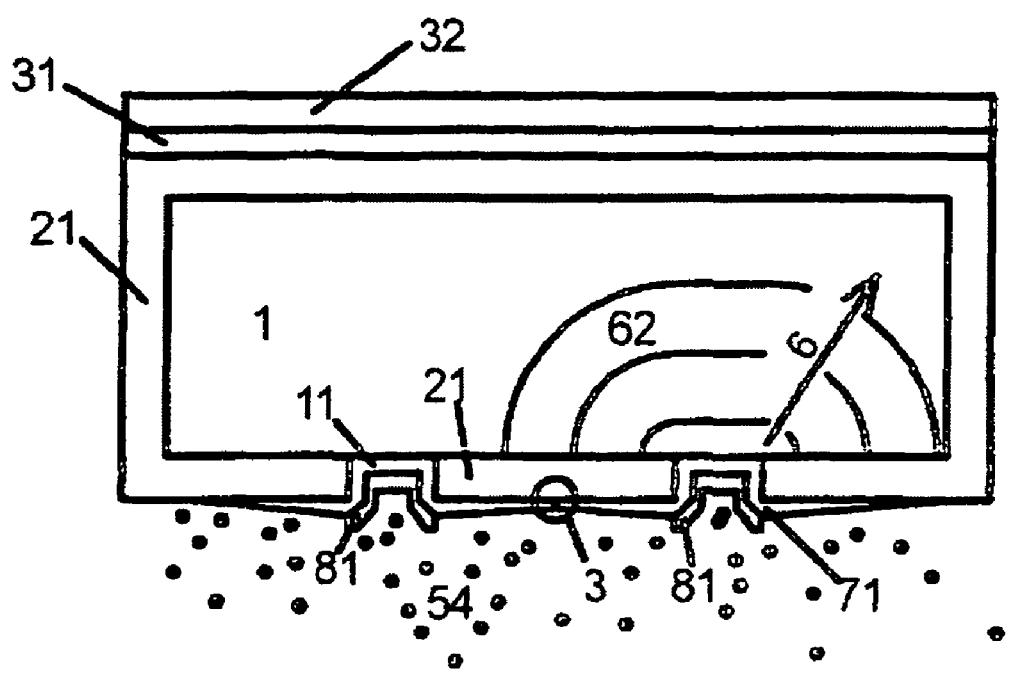

Figure: 3
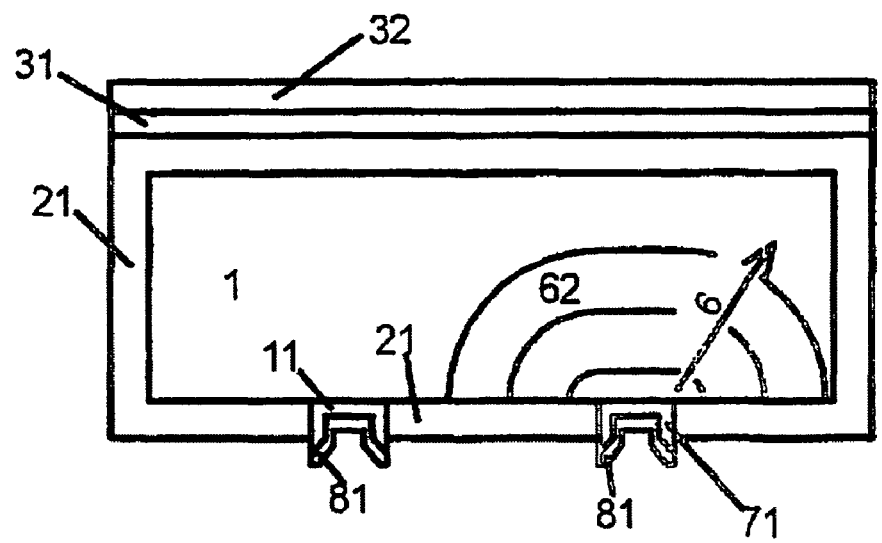
Figure: 4
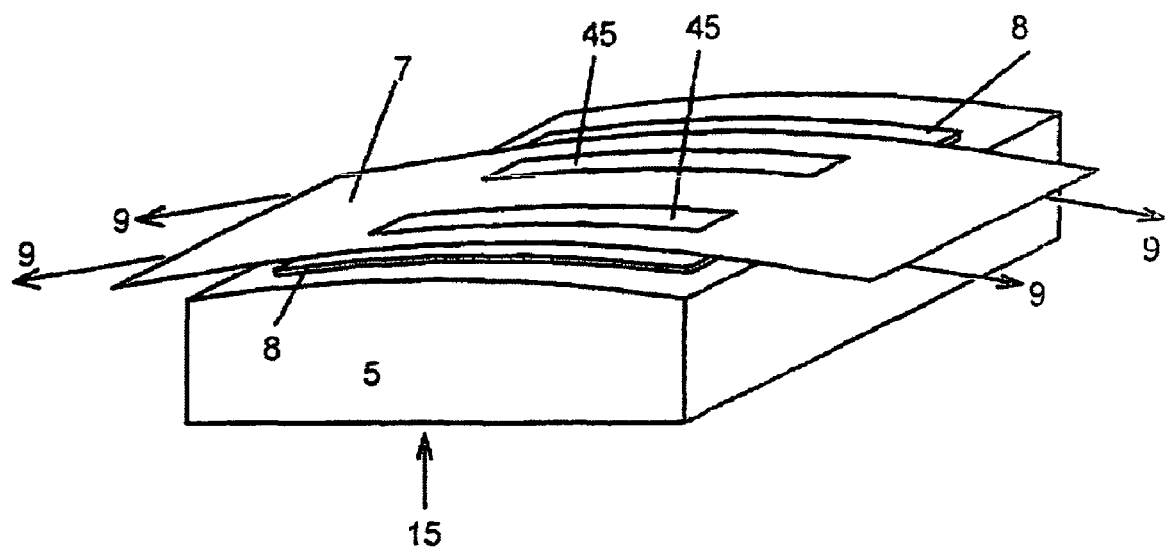

Figure: 5
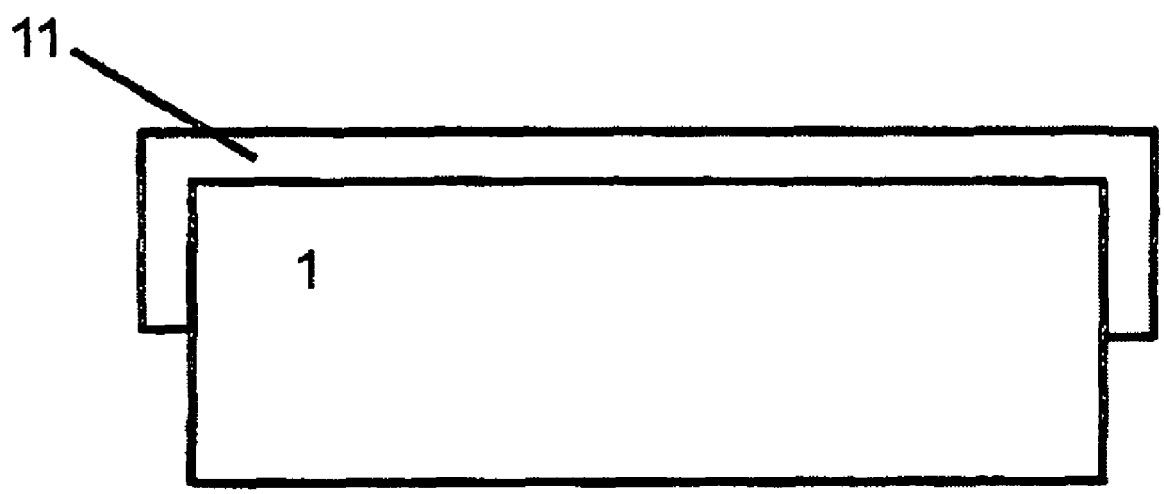
Figure: 6
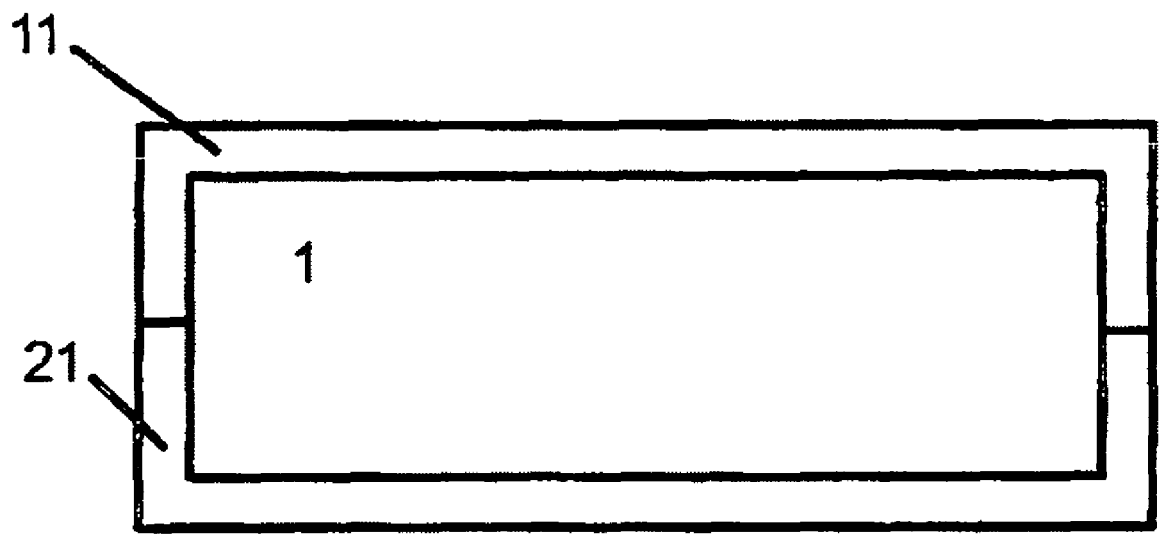

Figure: 7
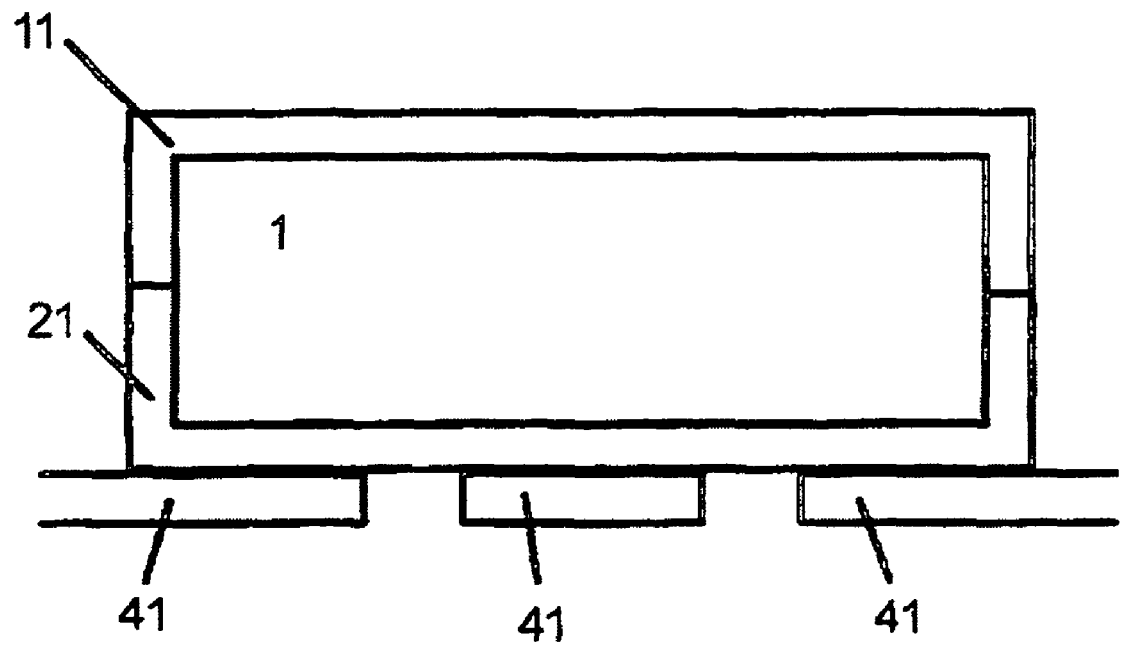
Figure: 8
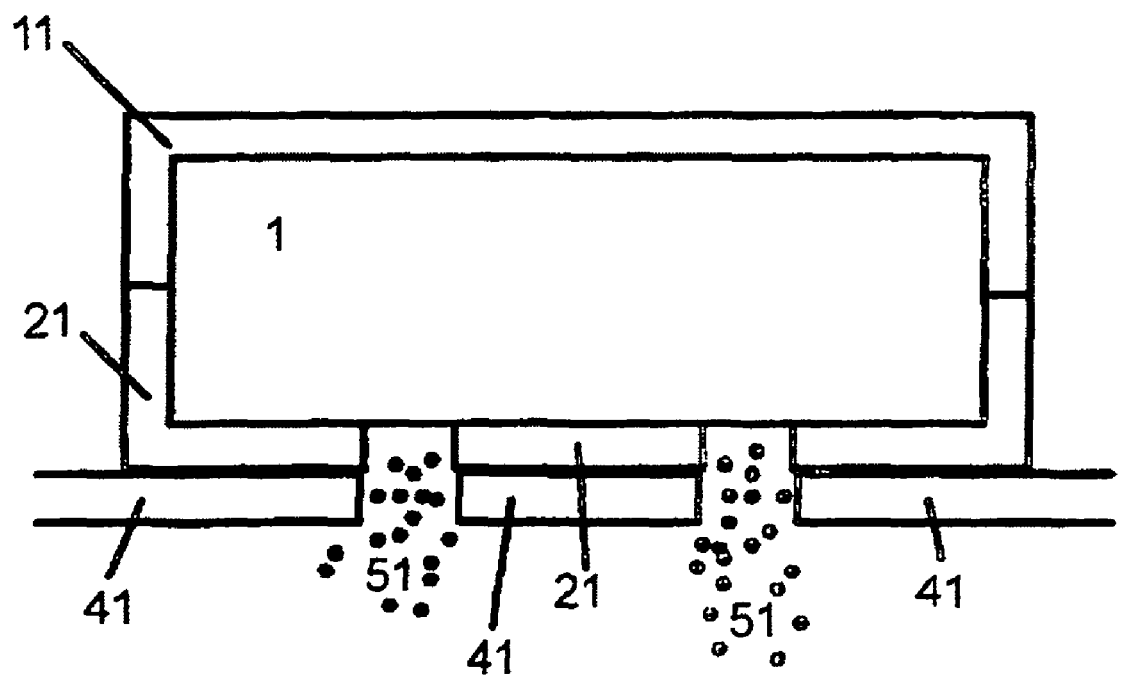

Figure: 9
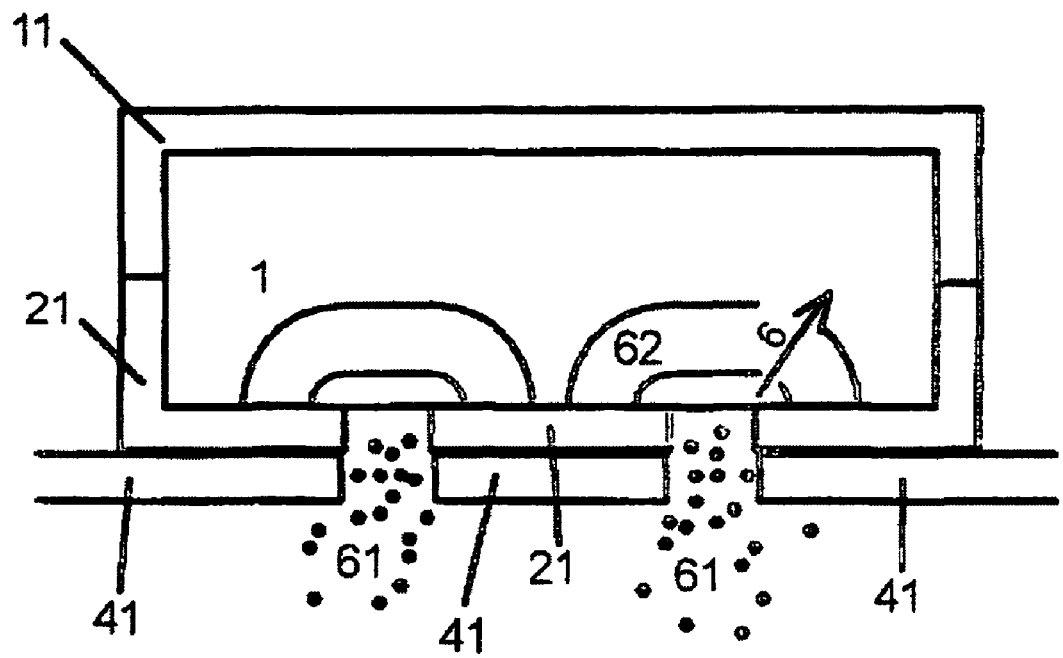
Figure: 10
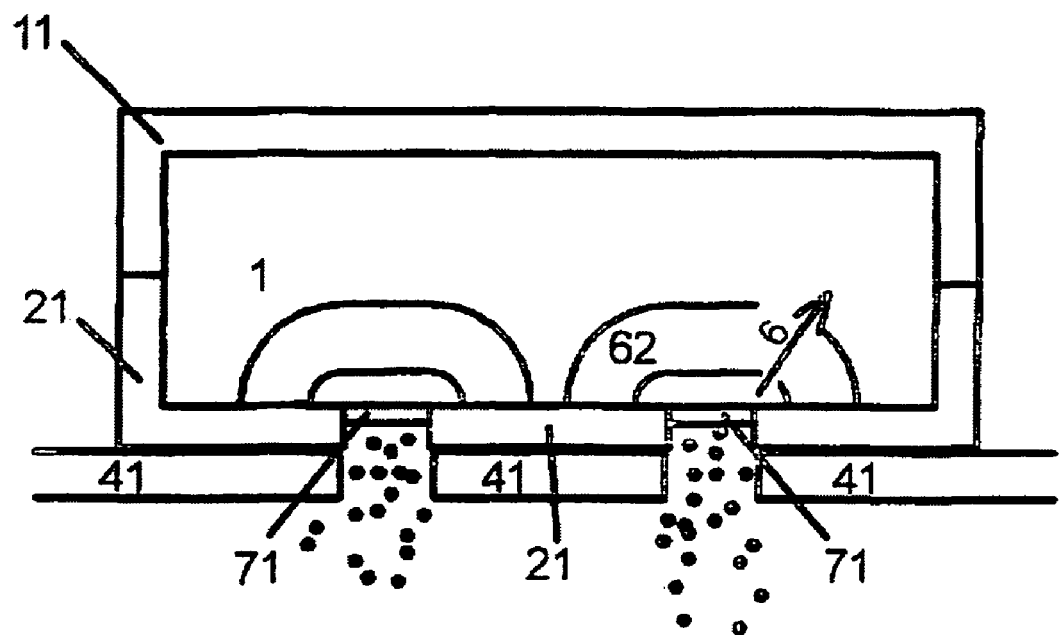

Figure: 11
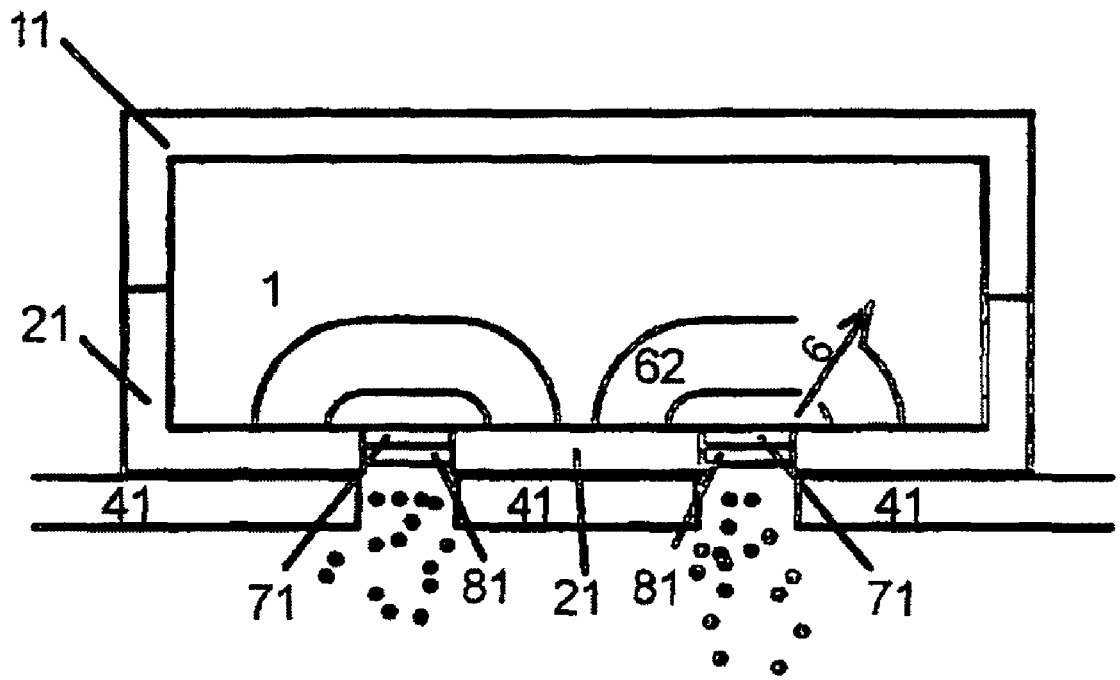
Figure: 12
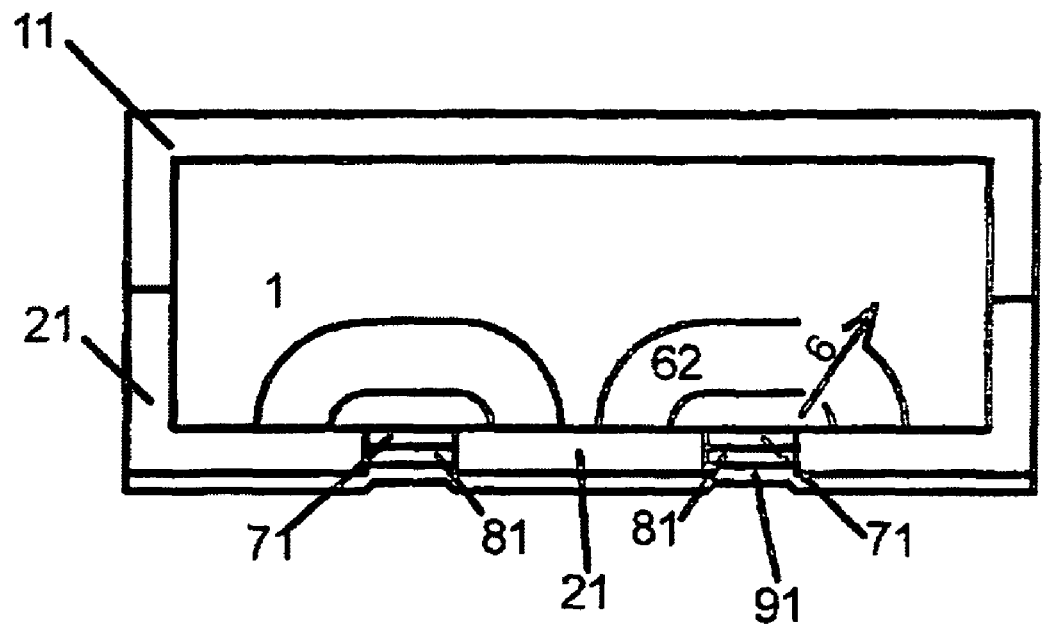

Figure: 13
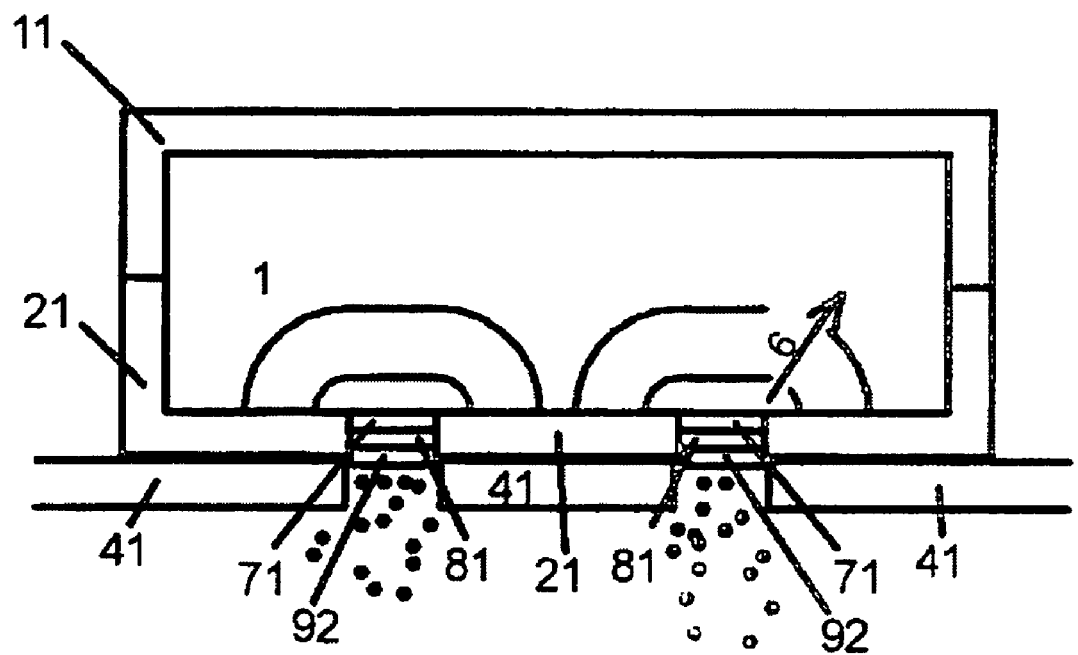
Figure: 14
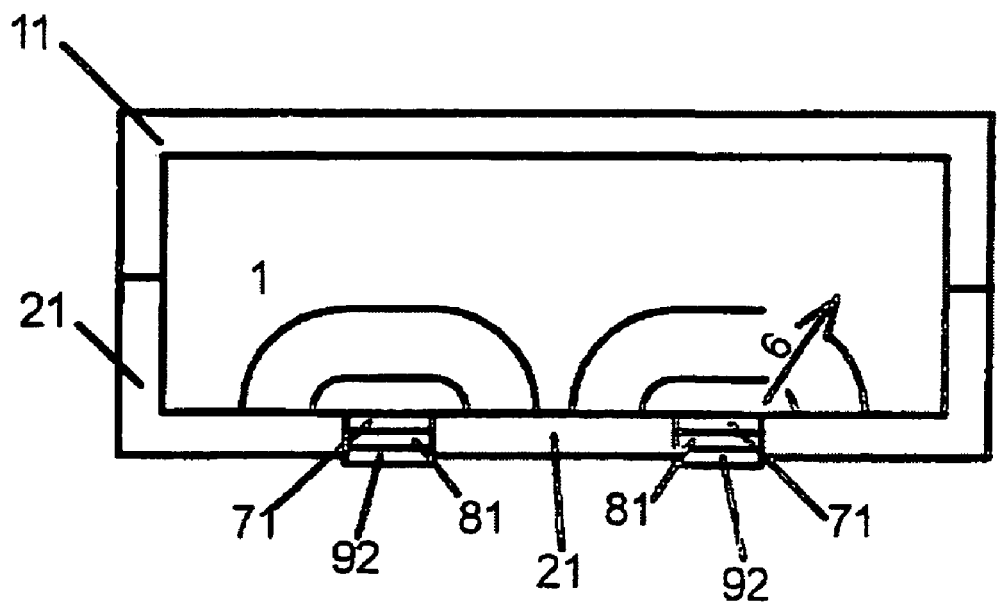

Figure: 15
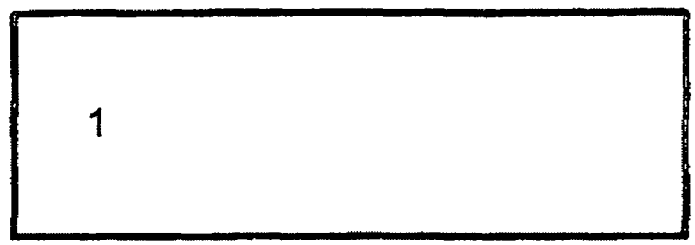
Figure: 16
Figure: 17
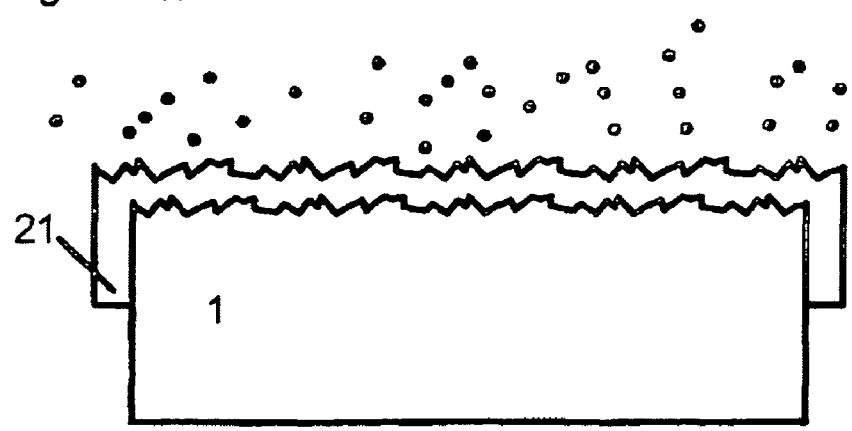

Figure: 18
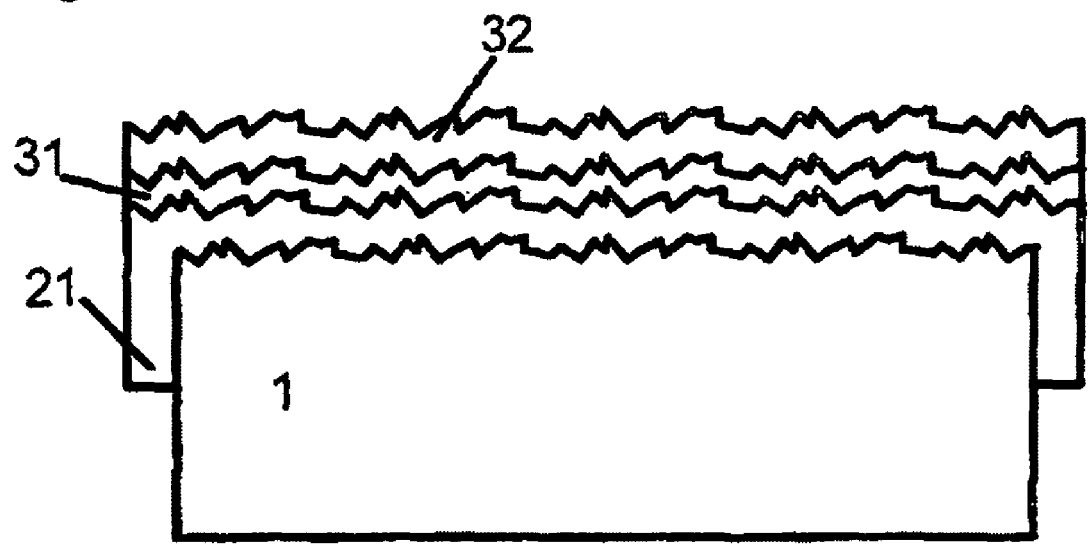
Figure: 19
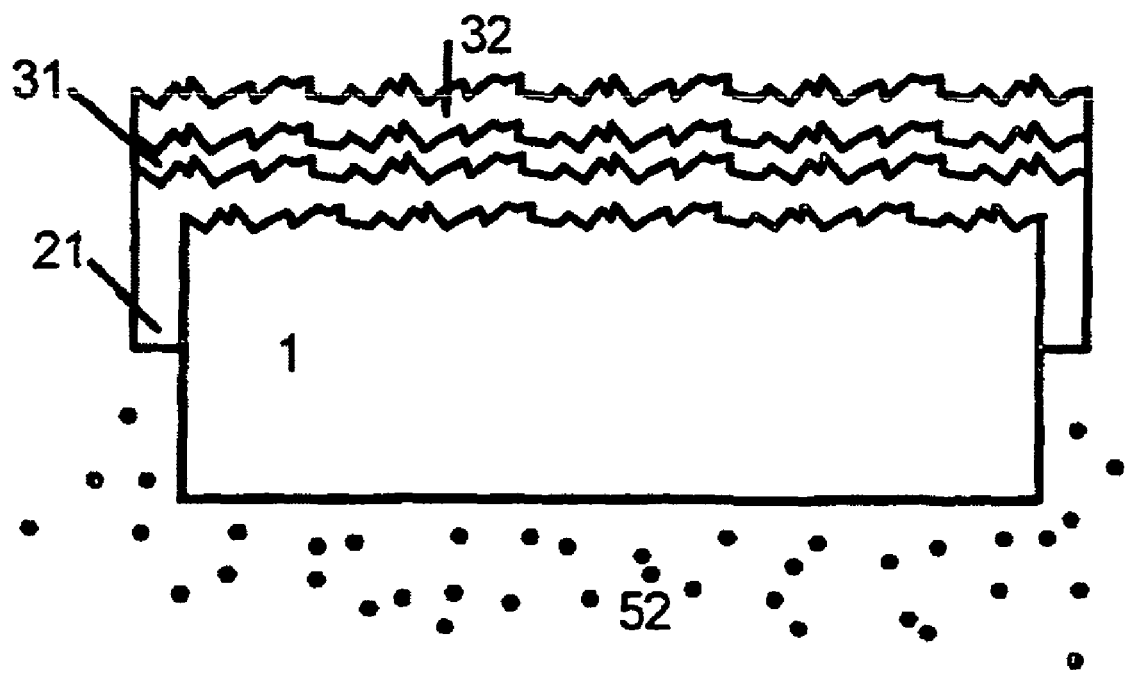

Figure: 20
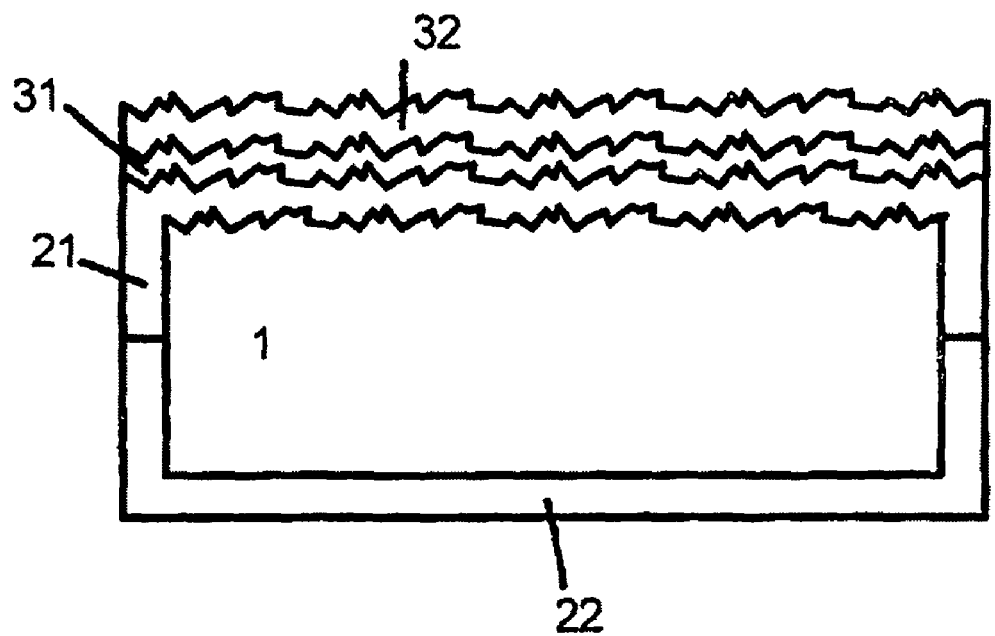
Figure: 21
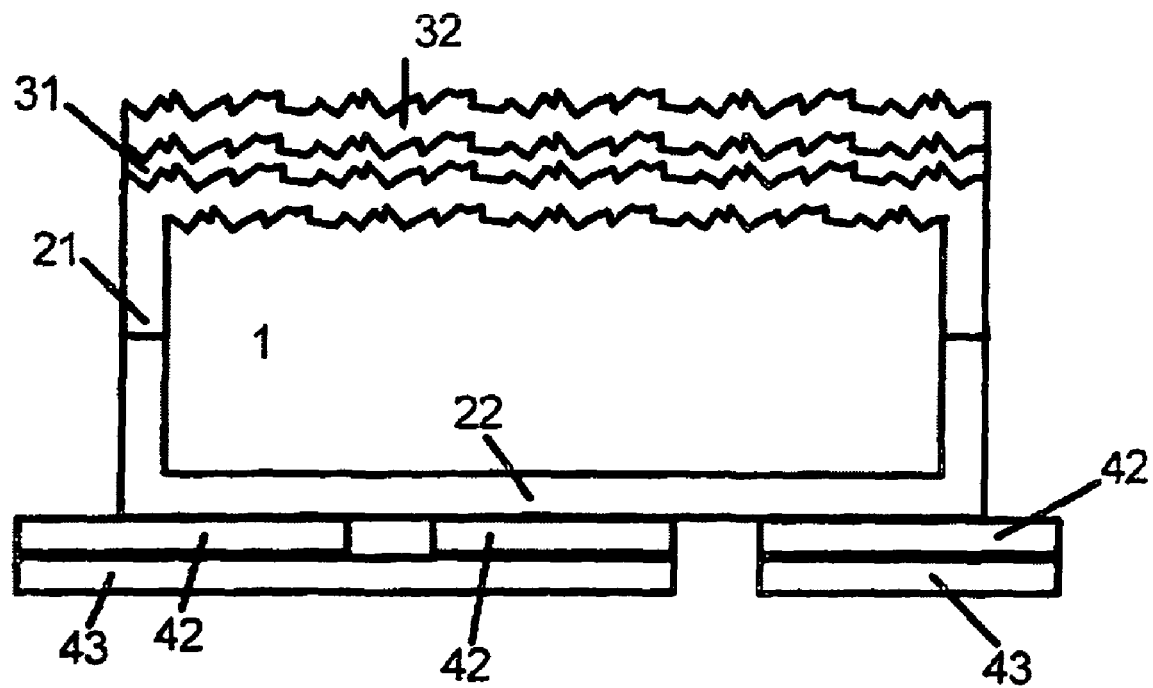

Figure: 22
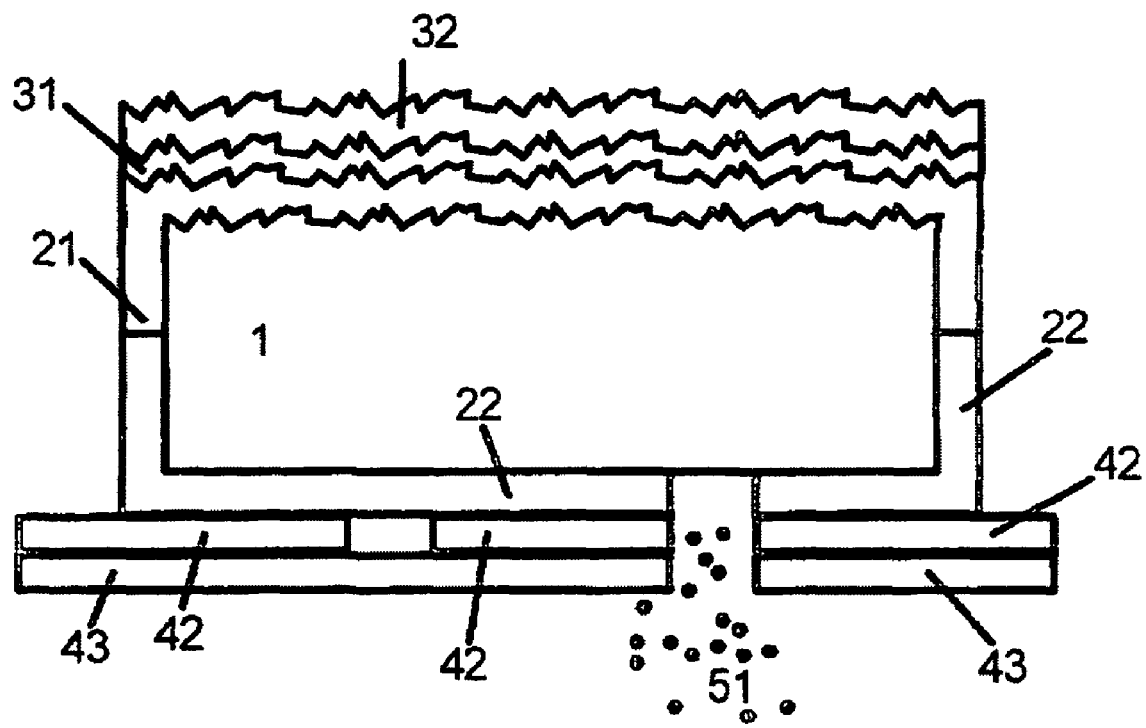
Figure: 23
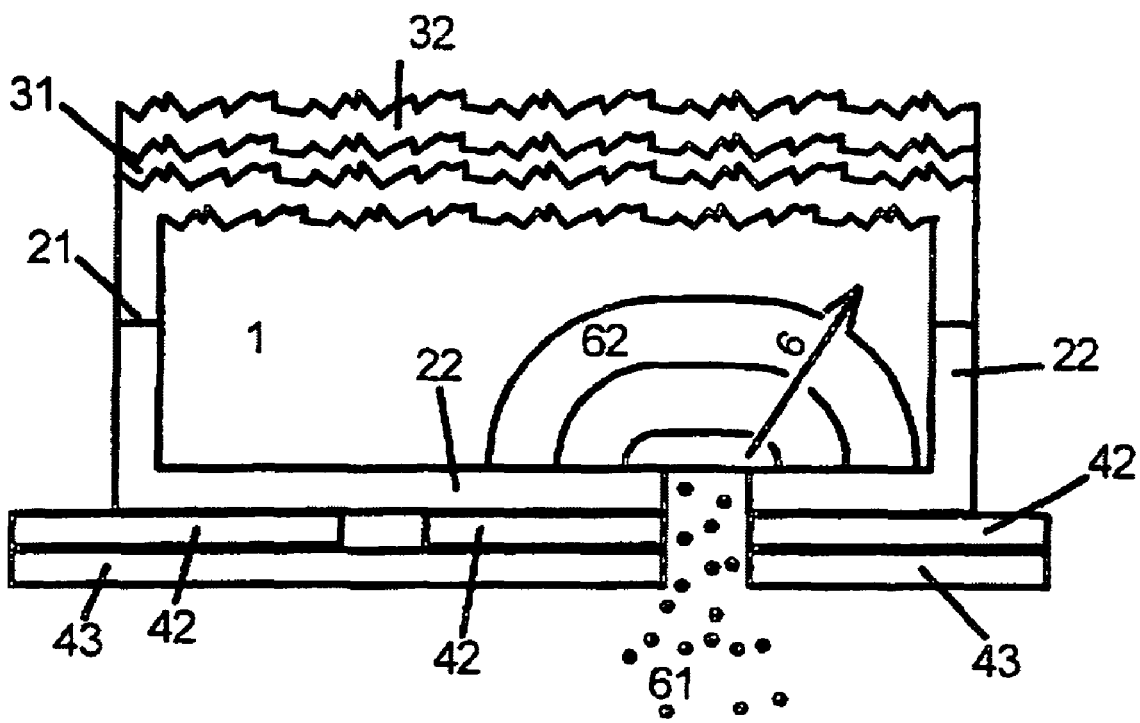

Figure: 24
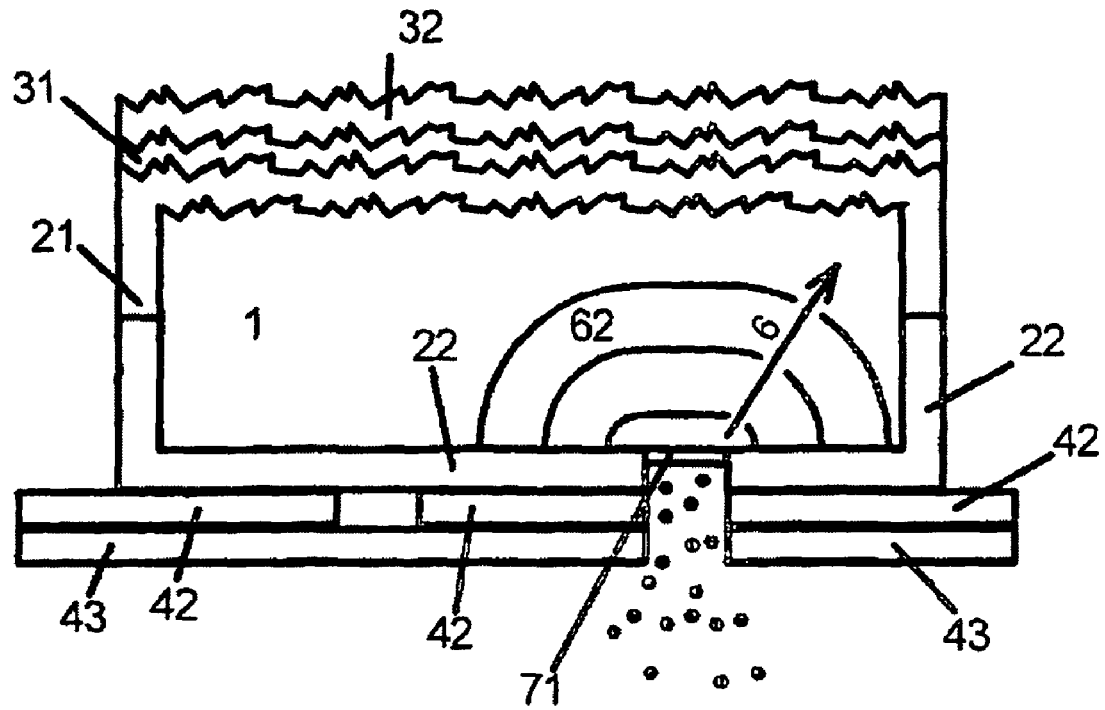
Figure: 25
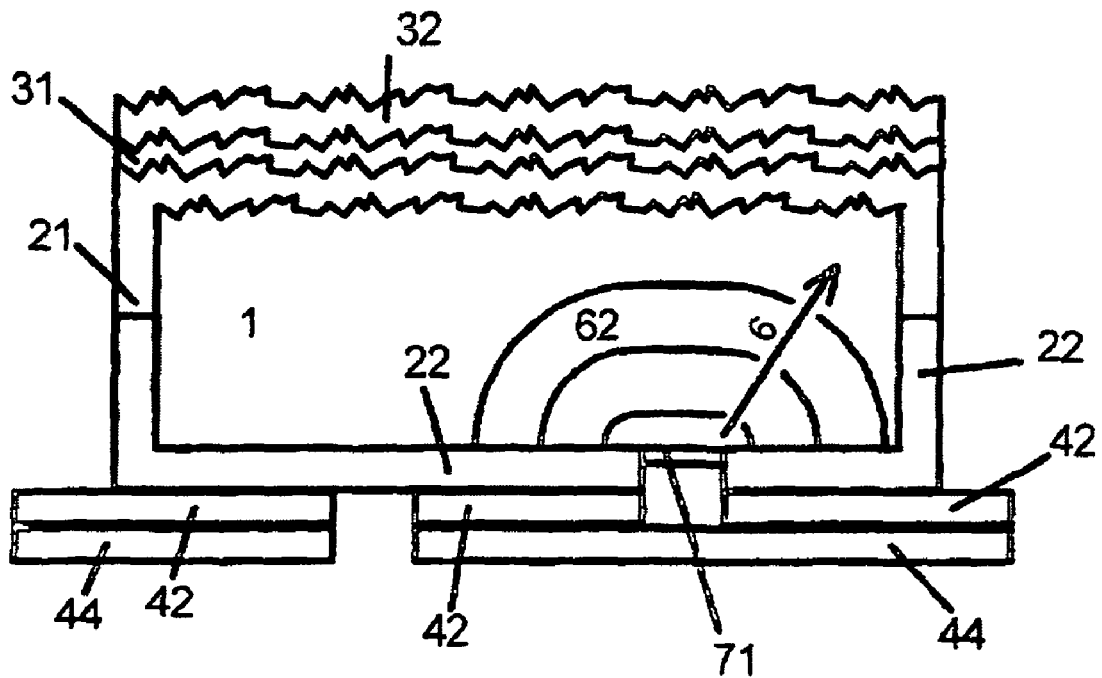

Figure: 26
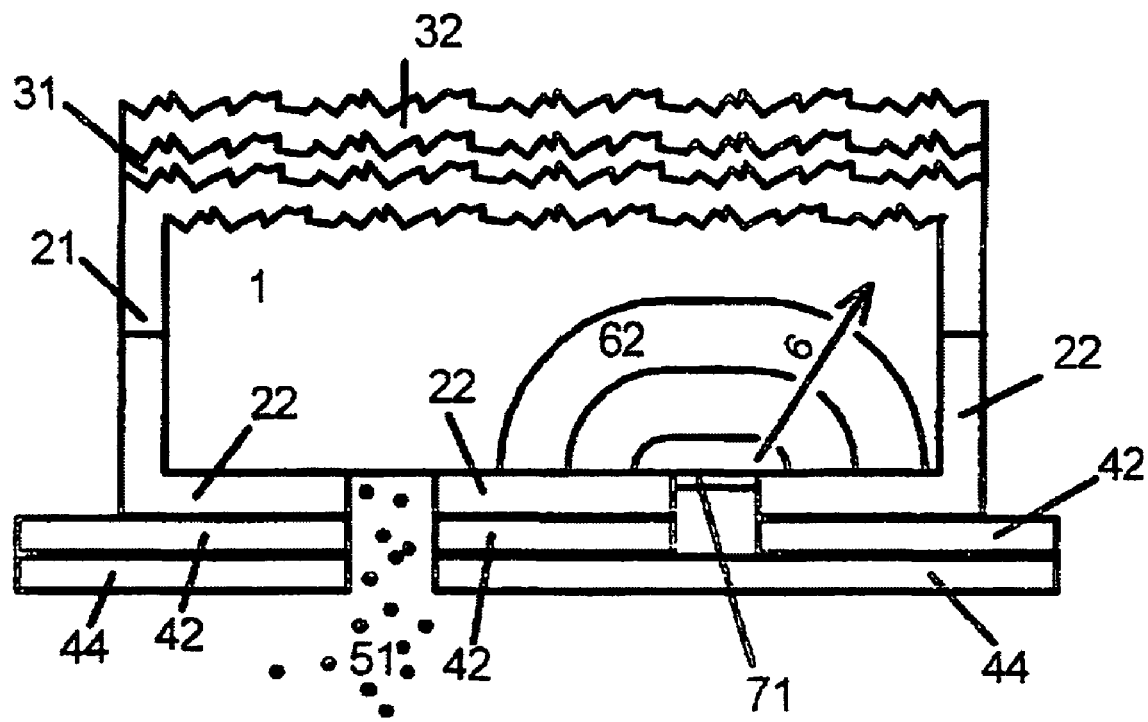
Figure: 27
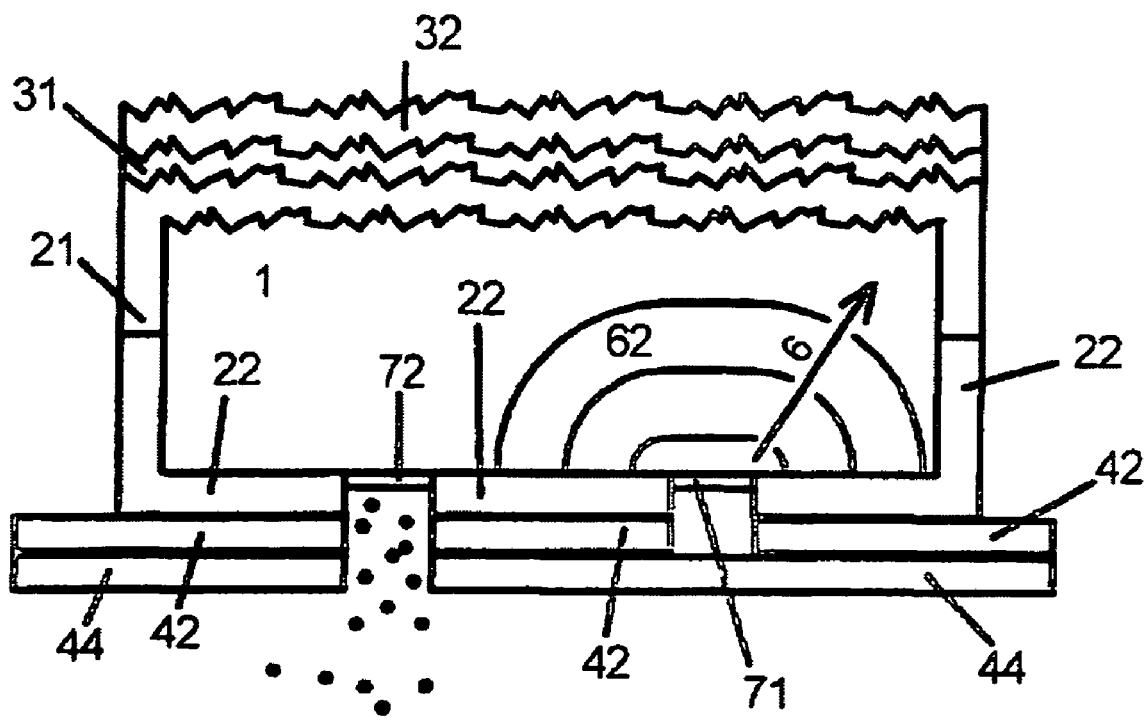

Figure: 28
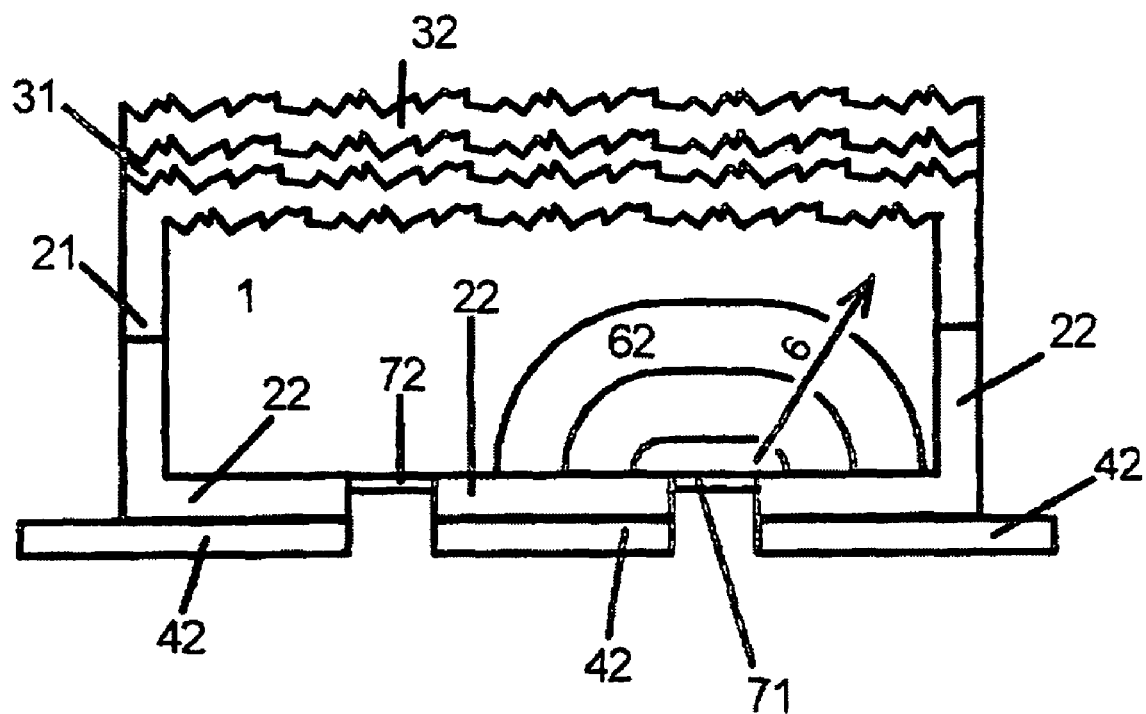
Figure: 29
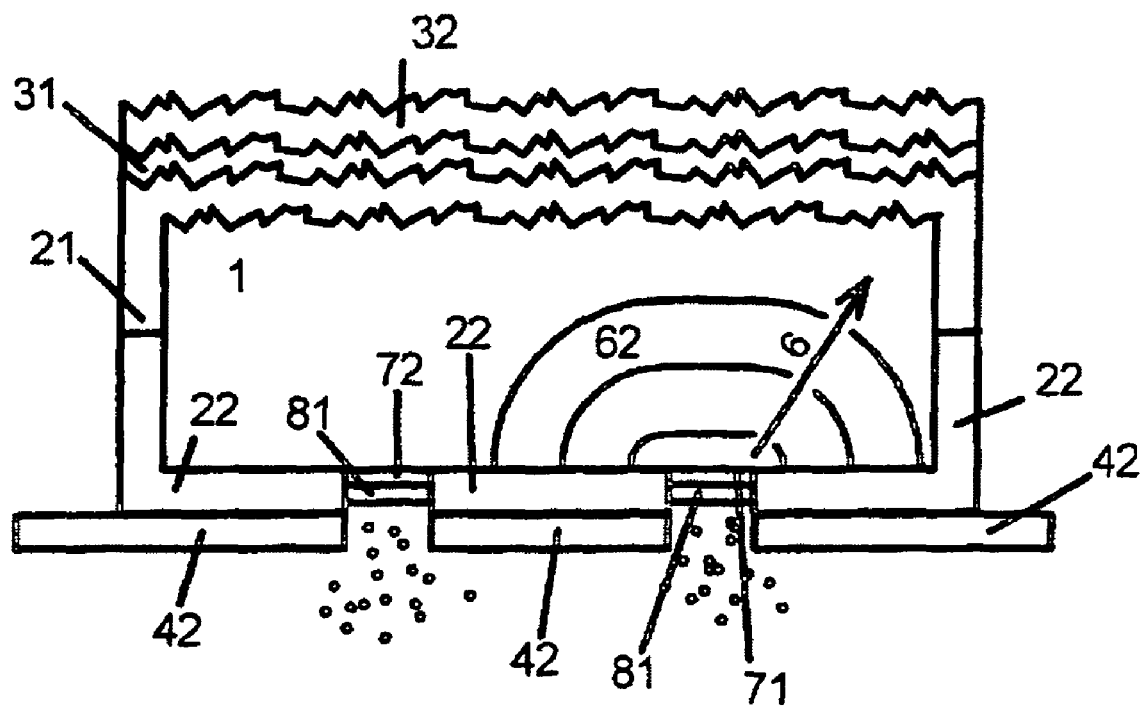

Figure: 30
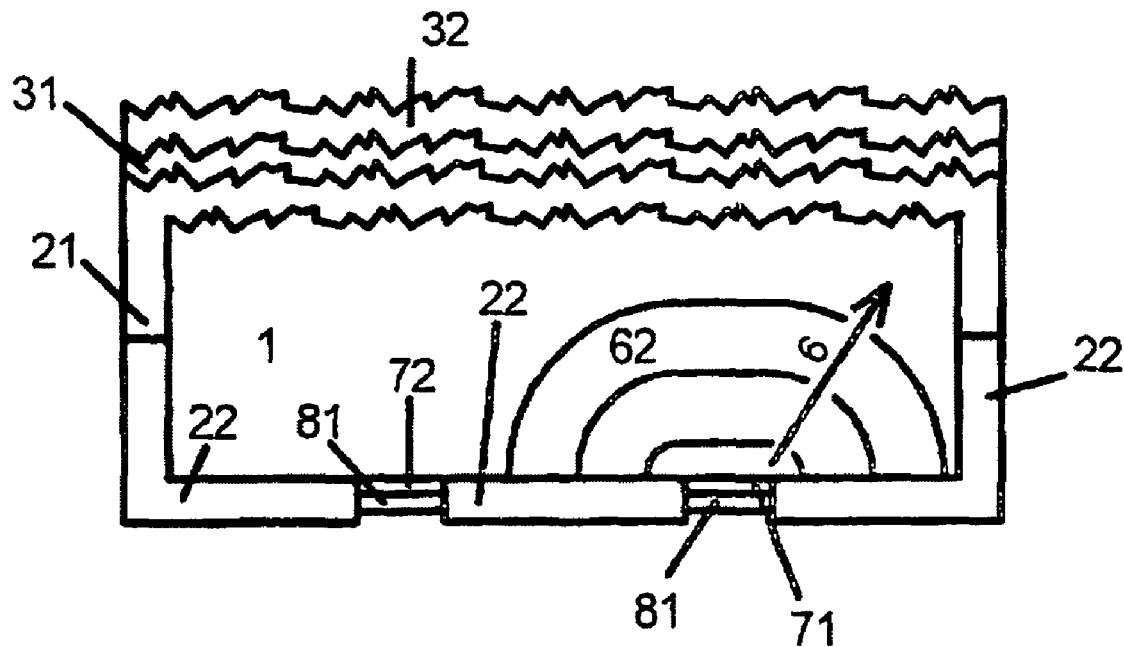
Figure: 31
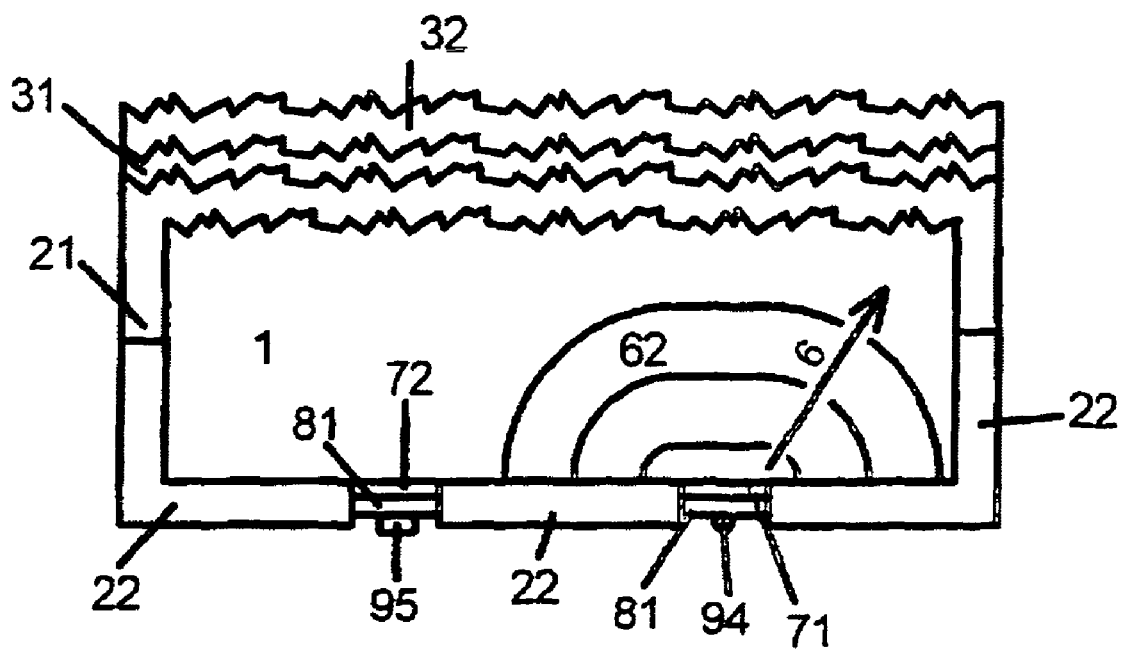

Figure: 32
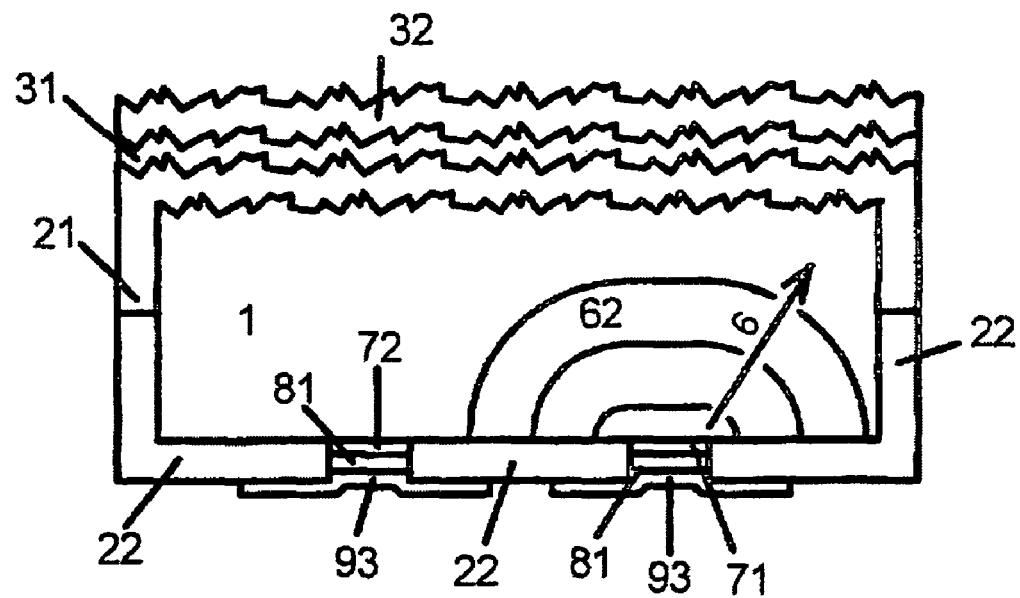
Figure: 33
Back view
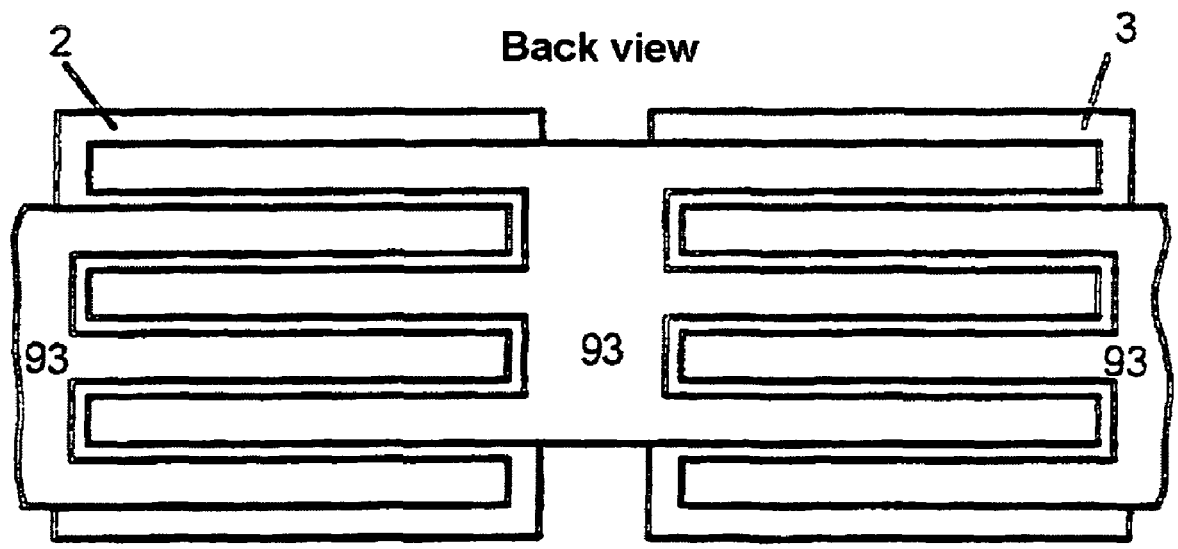

LOCAL HETEROSTRUCTURE CONTACTS

CROSS REFERENCE TO RELATED APPLICATIONS

This application is the National Stage of PCT/DE2007/001532 filed on Aug. 28, 2007, which claims priority under 35 U.S.C. §119 of German Application No. 10 2006 042 617.7 filed Sep. 5, 2006. The international application under PCT article 21(2) was not published in English.

1.1 Conventional Solar Cells

Conventional solar cells (FIG. 1) in [Goetzberger03] made of semiconductor materials (predominantly silicon) are designed so that the charge carriers generated by light are separated from each other before they can recombine again. As a rule, this is achieved by means of a pn-junction (wherein a p-conducting and an n-conducting layer are made to establish contact, which results in an electric field that separates the charge carriers). In order to lead the charge carriers that are separated from each other from the p- or n-layer to the outside, and thus make them electrically useable, on each side an electrical contact must be affixed that causes the lowest-possible losses. All the remaining surfaces of the semiconductor must be treated in such a way that only very low recombination takes place on them. They need to be passivated.

1.2 High-performance Silicon Solar Cells

In high-performance silicon solar cells the two premises (good contact and good surface passivation) are solved very well. Various concepts exist, each with respective variations (which are not discussed in detail):

1. The PERL (Passivated Emitter Rear Locally Diffused) cells (FIG. 1 in [Green98] comprise large passivated areas and small base contact areas on the back. Underneath the contact areas the silicon material is highly doped. On the diffused contact areas the undesired recombination always occurs, even if the area is designed so as to be particularly small. The production of such cells requires the following process steps:
   Over the entire area, surface passivation ($SiO_2$, $SiN_x$:H, a-Si:H, a-SiC:H, floating junction, ... ) is generated.
   On what will later be the contact positions of the base, this surface passivation is locally opened (first masked by means of photolithography, and subsequently wet-chemical etching, and mechanical laser ablation, ... ).
   By means of various methods (vapour deposition, sputtering, deposition from the liquid phase, screen-printing using pastes, ... ) metals are applied. In order to obtain very low contact resistance, beforehand high-doping takes place under the contact points. The metal is deposited as described above, and if necessary the surplus metal is subsequently removed (lift-off method).
2. The LFC (Laser Fired Contacts method FIG. 1 in [Glunz04]) uses a passivating, electrically non-conducting layer over the entire area. Onto it a metal layer is deposited over the entire area. This double layer is locally melted on by means of laser energy and is contacted as a result of this. The non-molten areas retain their passivating effect.
3. The COSIMA (Contacts to the a-Si-Passivated Surfaces by means of Annealing method, FIG. 1 in [Plagwitz05]) uses passivation, over the entire area, of amorphous silicon (a-Si:H) onto which aluminium is locally vapour-deposited. As a result of heating, an electrically well-conductive highly aluminium-doped silicon layer is created under the aluminium. The areas onto which previously no aluminium has been applied further passivate the non-contacted areas.
4. In the case of heterojunction solar cells [Schmidt06] and HIT-(-Heterojunction with Intrinsic Thin Layer solar cells, FIG. 1 in [Maruyama06]), the contact areas are the size of a substrate front or substrate rear. The hetero structures of these solar cells not only form a good contact but at the same time also keep the recombination on the contact area extremely low.
5. In the case of IBC (Interdigitated Back Contacts) solar cells (FIG. 1 in [Mulligan04]) the emitter- and base contacts are both arranged on the back of the solar cells in order to prevent shading loss as a result of gridfingers and collector buses (otherwise they cover up to 8% of the solar cell surface).

1.2.1 Disadvantages of the Above-mentioned Methods

Relating to 1

Local opening of the passivation layer is:
  very involved with the use of photolithography; the chemicals are expensive, and very considerable waste of media occurs. The method is correspondingly expensive.
  also expensive with laser ablation as a result of the very considerable investment costs and ongoing costs (lamps, cooling) involved.
  mechanically characterised by damage to the surface. Consequently, higher recombination losses occur on what will later be the contact.
Local doping underneath what will later be the contact positions is involved and expensive. Recombination occurs at the contacts (saturation currents $J_0 > 1000$ $fA/cm^2$).
In the highly-doped regions (from ~$10^{17}$ $cm^{-3}$) absorption through free charge carriers occurs, which absorption results in current losses.

Relating to 2

Local melting of the silicon can result in considerable stress and crystal damage that causes losses.
Recombination occurs at the contacts (saturation currents $J_0 > 1000$ $fA/cm^2$)
In the highly-doped regions (from ~$10^{17}$ $cm^3$) absorption through free charge carriers occurs, which leads to current losses.
There are considerable investment costs (laser) and ongoing costs (lamps, cooling).

Relating to 3

The COSIMA contact is associated with high contact resistance.
The aluminium has to be vapour-deposited locally.
The contact only works on p-type silicon.

Relating to 4

The heterojunction on the side facing the light has to have material characteristics that carry out several tasks at the same time. This makes process definition and process management extremely difficult. The heterojunction must:

1. passivate the wafer surface very well,
2. be highly doped,
3. be electrically well-conductive,
4. have low absorption (this applies to the emitter and to the TCO (Transparent Conductive Oxide)),
5. have a low defect density,
6. be very thin (approx. 5 nm),
7. have little surface roughness,
8. have a homogeneous layer thickness over the entire area, and
9. have a good contact to the TCO.

These requirements contradict each other at times. Therefore, in some cases only compromises of the characteristics can be achieved.

Relating to 5

In the case of the back-contact cell, the local contact structure is generated by means of photolithography or printable dopant pastes and subsequent diffusion processes. On the one hand this is involved and expensive; on the other hand the losses at the diffused contact points are associated with high recombination (saturation currents $J_0 > 1000$ fA/cm$^2$).

Generally speaking, it can be stated that diffused contacts have saturation currents [Swanson05] that are approximately 40-times higher than those associated with heterocontacts. As a result, the possible voltage level and also the performance level both decrease. Furthermore, in the case of HIT solar cells the performance-related temperature coefficients are considerably lower (−0.25%/° C.) than is the case with conventional solar cells (−0.45%/° C.) or high-performance back-contact solar cells (−0.38%/° C.) [Taguchi05]. This results in higher energy yields at increasing operating temperatures of the solar cells. When compared to the 25° C. of the Standard Test Conditions (STC), in summer, with full insolation, i.e. the highest yields, the cell temperatures rise to more than 80° C. This is clearly noticeable in the annual yield.

On the other hand, HIT solar cells are associated with approximately 7-8% shading loss as a result of the gridfingers and bus bars.

1.3 Commercially Available High-performance Silicon Solar Cells

The following are the cell concepts providing the greatest efficiencies that are presently commercially available: the HIT cells of SANYO Electric Co., Ltd. (SANYO), with module efficiencies of 16.2%, and 10 cm×10 cm laboratory solar cells with 21.8% [Maruyama06], as well as the back-contact solar cells of SunPower Corporation® (SUNPOWER), with module efficiencies of 17.7% [SP-220 06] (the actual efficiencies of the current laboratory cells would have to be better still than those of the SANYO products, but they are not known. The efficiency of the mass-produced solar cells of the 17.7% modules is 21.5% [SP-220 06]).

1.3.1 Measures Required to Improve the Efficiency of HIT Solar Cells

The HIT solar cell of SANYO has the highest open-circuit voltage and a very high current. Both of these are due to the very good heterostructure contacts that keep the saturation current low and that generate a very good back surface field (BSF). However, in the cells installed in the module, approximately 7-8% of the solar cell surface facing the sunlight is shaded as a result of the metal contacts (finger spacing 2 mm, finger width 85 μm [Taguchi05] and two bus bars with each being ~2 mm in width). (It would appear the high current of the record HIT solar cell can only have been achieved in conjunction with less shading (different metallization than is the case in mass production, e.g. vapour deposition and electroplating)). The area of metallization needs to be reduced. Furthermore, losses occur as a result of the TCO absorbing free charge carriers in the wavelength range between 300 nm and 450 nm (see FIG. 10 in [Sawad-a94], and similarly FIG. 19 in [Maruyama06]).

1.3.2 Measures Required to Improve the Efficiency of Back-contact Solar Cells In order to achieve still higher efficiencies in the SUNPOWER cells that do not have any metallization at the front, other contact structures have to be used in order to minimise losses at that location. This is explained in [Swanson05] (R. Swanson has developed the back-contact solar cell and is head of SUNPOWER). We refer to the HIT contacts as a solution to this.

Combining HIT contacts with a back-contact solar cell is essential to a further increase in the efficiency of silicon-based solar cells in the direction of the theoretical limit of 29%.

2. New Idea

Irrespective of the present protective rights of SANYO, at present there is a very strong interest, which has been steadily growing over recent years, in the solar cell industry and in international solar cell research, in HIT and heterocontact structures. This is due on the one hand as a result of their outstanding opto-electronic characteristics in the context of solar cells, and on the other hand by the knowledge-lead which the Japanese enjoy.

2.1 What is New?

The new idea, shown below in an exemplary embodiment, differs in the following points from the methods, patents and publications known to me:

- The silicon wafer is first completely passivated and subsequently the positions to be contacted are opened by means of plasma etching.
- Plasma etching takes place by an affixed thin elastic film with local linear and/or point-shaped openings.
- The same mask is used for deposition processes of local heterocontacts.
- These local heterocontacts can be designed so that they are transparent to light.
- These local heterocontacts can be designed so that they comprise high internal reflection.
- The local heterocontacts cause lower electrical losses than is the case with conventional, diffused contacts or diffused local contacts, and are thus suitable for higher efficiencies of solar cells than have hitherto been achieved.
- If two masks, one placed above the other, are used it is possible to produce back-contact solar cells without the use of ortholithography, diffusion and wet chemistry.
- In the case of the back-contact solar cells, the emitter contact and the base contact are both located on the back of the solar cells. All the SANYO patents known to me without exception describe solar cells in which one contact is located at the front while the other contact is located at the back.

There is no longer any need to precisely position the individual etching- and deposition processes (self alignment).

Any spread of plasma residues from previous plasma processes is minimised (see section 2.6).

In order to achieve long diffusion length, as an additional process step, the sample can locally be subjected to hydrogen plasma by way of the same mask, and in this way a doping gradient can be generated by means of thermal donors. Thus in the case of back-contact solar cells larger distances between the emitter contact and the base contact can be achieved with the use of favourable Czochalski-material. The collection probability is increased in conventional and wrap-through solar cells.

2.2 New Methods

2.2.1 Plasma Etching and Deposition with the Use of Shadow Masks

In the new method a passivating layer that has been applied over the entire area is to be opened up by plasma etching at what will later be the contact points. In order to etch the passivation layer only locally, to this effect the passivated semiconductor sample is covered by means of a shadow mask (e.g. by oxidation, deposition of a-Si:H, SiN:H, a-SiC:H, SiC, ...) and then etched. Provided the mask is not displaced for further process steps in relation to the semiconductor, said mask can subsequently be used as a deposition mask for metallization, as a TCO (transparent conductive oxide) or as a heterocontact. If two masks are used, with one placed above the other, wherein the upper mask comprises only each second opening, in this way it is also possible to produce back-contact cells [Mulligan04] (see example section 2.6).

The etching process can, for example, take place in an RIE (Reactive Ion Etching) facility with etching gases such as $SF_6$, $CHF_3$, $CH_4$, $O_2$, $NF_3$ etc. Very good results have recently also been obtained in Atmospheric Pressure CVD facilities (AP-CVD) in which the entire vacuum technology can be done without, and thus very considerable investment expenditure and maintenance expenditure as well as pumping times can be saved.

2.2.2 Producing Local Drift Fields by Means of Thermal Donors with the Use of Shadow Masks Furthermore, the mask can be used to locally generate, in solar cells, thermal donors (TD) from intrinsic oxygen. Thermal donors can be generated in oxygen-rich silicon by means of hydrogen. If an oxygen-rich silicon sample, e.g. standard-Czochalsky silicon (oxygen content of approximately $10^{18}$ $cm^{-3}$), is subjected to a hydrogen plasma, the hydrogen diffuses into the silicon. A hydrogen concentration gradient arises. Along this gradient, several oxygen atoms form to become donors (as a result of annealing, e.g. at 450° C., thus the term "thermal donors"). Doping takes place in a manner proportional to the hydrogen concentration. Thus, a doping gradient can be generated depending on the hydrogen concentration [Job98]. The maximum density of TD, depending on the oxygen concentration in the silicon, is approximately $3 \times 10^{16}$ $cm^{-3}$. This is sufficient for undoping p-type material. By means of this method it is possible, for example, to produce a pn-junction (FIG. 2a in [Huang04]). At higher temperatures, e.g. 550° C., within 20 min, gradients that are 300 µm in depth can be generated.

Generating doping gradients (even without a pn-junction) results in significantly improved collection probability of the minority charge carriers (FIG. 3 in Scherff06), because they are accelerated towards the contacts as soon as they are located in the drift field (DF). In my own experiments, a doubling of the effective diffusion length (FIG. 4 in Scherff06) has been observed with the application of the TD, although, due to the hydrogen plasma treatment, damage on the back occurred (the process used was not optimised for solar cells).

This method is already proposed in [Ulyashin01], but not for local drift fields. Question: To what extent is the paper prejudicial as to novelty? To what extent could the method relating to the deep drift fields over the entire area be patented despite the publication by Ulyashin?

If hydrogen plasma treatment is carried out with the use of the mask described above, in this way local doping gradients (drift fields) similar to local BSFs (Back Surface Fields) can be produced; such as described for example in [Green98]. However, in the same period of time and at lower temperatures these BSFs can project considerably more deeply into the substrate. This then results in a significantly increased collection probability for the minority charge carriers, in particular for substrates whose diffusion length is large relative to the wafer thickness, because said charge carriers are accelerated towards the contacts as soon as they are located in the deep drift field. In back-contact solar cells the drift fields can act laterally from the emitter contacts to the base contacts. The influence that drift fields have on the efficiency of solar cells is investigated in [Cuevas97]. Even though the investigated cell structures differ from the structures described in the present document, it is evident that the diffusion length in the direction of the drift field is increased by a factor of 3 to 10 if there is a doping gradient of one or two orders of magnitude. In order to achieve the same effect with the use of a better silicon material, silicon with a tenfold or hundredfold minority carrier lifespan would need to be used.

Since by means of thermal donors at the most only $3 \cdot 10^{16}$ $cm^{-3}$ donors can be produced, and for a doping gradient of one to two orders of magnitude substrate doping is consequently around $3 \cdot 10^{15}$ $cm^{-3}$ or $3 \cdot 10^{14}$, an additional BSF is needed in order to obtain a sufficiently high built-in potential and correspondingly high open-circuit voltages. In the examples of sections 2.6 and 2.7 the highly-doped amorphous silicon layers of the back-contact form the BSF.

BRIEF DESCRIPTION OF THE DRAWINGS

The Figures show:

FIG. 1 solar cell with short circuit between emitter and base contacts due to gap between mask and back surface;

FIG. 2 selective etching process to remedy the short circuit between emitter and base contacts shown in FIG. 1;

FIG. 3 solar cell after removal of short circuit between emitter and base contacts;

FIG. 4 wafer placed onto a concavely carrier and pressed against a film acting as a mask;

FIG. 5 production of pn-junction on silicon wafer;

FIG. 6 passivation of the wafer back surface;

FIG. 7 placement of a mask onto the wafer back surface;

FIG. 8 etching of wafer back surface through mask;

FIG. 9 producing a back drift field by way of hydrogen plasma treatment;

FIG. 10 plasma deposition of local back-contacts;

FIG. 11 sputtering of TCO to produce contact areas;

FIG. 12 deposition of a metal layer over entire wafer back surface;

FIG. 13 preparation of the local back contacts;

FIG. 14 removal of the mask from back surface;

FIG. 15 untreated n-type Czochalsky based wafer;

FIG. 16 plasma-etching of the saw damage and texturing of wafer front surface;

FIG. 17 deposition of passivation layer onto wafer front surface by means of a plasma process;

FIG. 18 deposition of a double-layer of anti-reflection coating onto wafer front surface;

FIG. 19 plasma-etching to remove saw damage on the wafer back surface;

FIG. 20 deposition of passivation layer onto wafer back surface by means of a plasma process;

FIG. 21 placement of a double-mask onto wafer back surface;

FIG. 22 locally opening of the passivation by way of plasma etching;

FIG. 23 producing gradient of thermal donors by way of a hydrogen plasma treatment;

FIG. 24 plasma deposition of back-contact base;

FIG. 25 replacing the second mask for emitter creation;

FIG. 26 locally opening of passivation by way of plasma etching;

FIG. 27 deposition of emitter contact to create pn-junction;

FIG. 28 removal of the second mask after emitter creation;

FIG. 29 sputtering of a TCO layer onto wafer back surface through masks;

FIG. 30 finished solar cell;

FIG. 31 optional application of narrow metallization lines on wafer back side;

FIG. 32 HIT-BACK solar cell with bonded-on cell connectors; and

FIG. 33 top view of two HIT-BACK solar cells connected by bonded-on cell connector.

2.3 Process-typical Requirements

As already partly described above, the following facts still need to be worked on:

The surface passivation layer, which is instrumental in obtaining high efficiencies of solar cells, must not be damaged, otherwise drops in performance will be incurred [Breitenstein06]. Depending on the thickness and hardness of the passivation layer and the material of the shadow masks that are directly placed onto the passivation layer, there is a requirement for further development in this area.

As a rule, passivation comprises a very hard material ($SiO_2$, SiN:H, a-Si:H, a-$SiC_x$, $SiC_x$, or similar). In order to nevertheless look after this layer, the shadow masks need to be put in place gently, or the layer can be coated with a soft layer, for example a polymer layer. With the use of thin film, which can also comprise soft coatings or which can entirely comprise a polymer, in this way no problem will occur. Even if metal film is used, in the case of hard passivation layers there is no danger if the film is thin (flexible) and does not comprise a bur resulting from the structuring process (opening of the masks with lasers, water jet, . . . ). Any burs that may be present can be removed by etching or grinding).

Since opening the contacts takes place on the side facing away from the light, passivation can also be thicker at that location. Furthermore, a hard protective layer can be applied to the passivation in order to render it mechanically more resistant.

The affixed film or masks need to rest tightly against the samples over the entire area so that lateral etching or undercutting of the masks is prevented. Otherwise this could result in short circuits if the emitter contact and the base contact touch each other (FIG. 1, local short circuit (3) due to the shadow mask (42) not having been pressed flat. Contact between the emitter (11) and the BSF (71) underneath the mask).

In those locations where the mask does not rest flat the etching rates and deposition rates rapidly decrease from the mask edge so that the contacts may turn out to be somewhat wider, and/or the passivation layer may turn out to be somewhat thinner. In order to generate a short circuit, the mask needs to be in place very badly. With the selection of corresponding process parameters the etching process is to be managed in such a way that as far as possible the etching direction is perpendicular to the wafer surface. In [Jansen95] such a method is described in the context of a silicon process (with the latter being suitable, for example, for the removal, by etching, of a passivation layer comprising a-Si:H, FIG. 8).

If nonetheless a short circuit between the emitter and the base contact has occurred, the layer thickness that causes this short circuit will be very thin. After completion of the TCO and/or metal deposition, this short circuit can be remedied by a short etching process over the entire area. Due to the etching selectivity of the individual plasma etching processes, furthermore, any undesirable etching of other layers can be prevented (the TCO or metal masks the contacts. Remedial action relating to the short circuit (3) between the emitter (11) and the BSF (71) by means of a short and selective etching process (54). The TCO (81) masks the contacts. FIG. 3, the emitter (11) and the BSF (71) are not removed underneath the TCO (81).

The samples, together with the mask, are transported to various process facilities. In this process the masks must not slide out of place.

This represents a requirement, which is mechanically solvable if thick shadow masks are used. In the case of affixed masks, sliding out of place is not possible. (FIG. 4, the passivated wafer (8) is placed onto the concavely curved carrier (5), and as a result of the force (15) both are pressed against the film (7) that is tensioned as a result of tensile forces (9). As a result of this, the wafer and the film conform to the curvature of the carrier. The film has now been pressed flat and can no longer slide out of place. The etching- and deposition processes can then take place through the local openings (45) of the film).

The processes must leave surfaces that as far as possible are without residues, surfaces that at worst have only slight surface damage so as not to negatively influence the solar cell characteristics. In [Stangl01, Stangl03] the influence of defects on the a-Si:H/c-Si pn-junction is described.

Known plasma etching processes often leave etching residues [Zhang00] that have to be removed. One option is described in [Lim98]. Etching residues can be removed by sequential etching (two successive processes in which the second process only removes the residues of the first process). Even with very aggressive plasma etching processes and without removal of these residues, useable solar cells can be produced [Salsuro01, Tucci01].

The SANYO patent [SANYO03a] describes a way of removing, and/or compensating for, impurities on the silicon surface. In [Glunz06], in-situ, first a wafer is cleansed by means of a plasma process, and subsequently the surface is passivated with $SiC_x$. Outstanding results have been achieved with the use of this method.

2.4 Advantages

2.4.1 Advantages when Compared to Back-contact Solar Cells

The emitter- and base contacts, instead of being formed as a result of diffusion of dopants, are formed by deposition of heterostructure contacts through shadow masks:

Process differs from those at SUNPOWER and SANYO (no encroachment on protective rights?!)

Higher voltage level (record cell has 719 mV open-circuit voltages; highest value up to 730 mV [Maruyama06]) due to lower saturation current at the contacts [Swanson05] (with HIT contacts a saturation current of $J_0=18$ fA/cm$^2$ is achieved, while diffused contacts only achieve $J_0=1000$ fA).

HIT solar cells, with −0.25%/° C. (laboratory cell) or −0.28%/° C. (mass production) have a lower output-related temperature coefficient than do conventional solar cells (~−0.45%/° C.) or back-contact solar cells (−0.38%/° C.) [Taguchi05].

Contact areas can turn out to be larger than is the case with Sunpower A300 because the saturation current of HIT contacts is lower by a factor of 40 than that of semiconductor contacts/metal [Swanson05].

Larger structures allow simpler alignment with alternative metallization (low-temperature screen-printing metallization on TCO [Windgassen05] or bonded cell connectors on TCO [Scherff06] instead of soldered cell connectors).

Larger contact areas equate to fewer problems with the solar cell series resistance.

There is no need for any high-temperature steps, which are always associated with diffusing impurities.

There is no negative effect on the diffusion length

No phosphorus diffusion (numerous work steps)

No boron diffusion (numerous work steps; uppermost layer of boron doping (boron-rich layer) might have to be removed again)

If the surface is to be passivated with SiO$_2$, this can, however, also be effected by wet oxidation at only 850° C.

Very good internal reflection of the back

With the use of a-Si:H/TCO/metal contacts instead of a-Si:H/metal contacts, very high internal reflection is achieved due to the low refractive index of the TCO (ITO, ZnO n~1.8). (SUNPOWER has its own patent relating to a contact structure with highly reflective metal [MulliganPAT06]).

Depending on the layer design, very high internal reflection is also achieved in the areas between the contacts (e.g. with SiO$_2$ or some other material that has a low refractive index, or with multilayer systems comprising a first layer with a low refractive index)

Very simple process

No photolithography

Shadow masks are used

More economical

Requires little in the way of process equipment. Ideally all the plasma processes can take place in one chamber (this is only a guess. a) In our three-chamber plant we have not yet noticed any effects as a result of the spread of residues, presumably because our processes are carried out with little hydrogen dilution, and thus deposition is essentially characterised by deposition of the a-Si:H-layers and less so due to etching as a result of a high hydrogen content. b) Between the depositions towards doped layers, in the examples mentioned an etching process takes place for opening the passivation layer, which process removes the residues of previously deposited layers of different doping. c) With the use of two masks, one placed on top of the other (back-contact solar cell), the sources for possible re-deposition are covered, because as a result of the plasma etching processes and changing of the masks any spread of substances from the previous process is minimised.

Saves time

Greater throughput

Improved process control as a result of shorter process duration

Reduced wafer breakage in that:

Monocrystalline wafers are used.

Wafers are not transported in a freely-swinging manner.

There is no frequent sorting of wafers into and out of carriers.

The wafer is affixed underneath the film (if shadow film is used, the wafer is placed onto the generated surface of a cylindrical carrier, and the shadow film is stretched over it. The required deflection is very slight (cylinder radius ~3 m). Even to wafers that measure 350 μm in thickness this poses no problems. Since the wafer can only bend in the radius specified for it, no great local mechanical tension can occur in it. The stress is homogeneously distributed over the entire area. For all intents and purposes the wafer finds itself in a type of corset. Without this corset, any forces that act on the wafer result in parabolic deformation and thus in extreme local mechanical stress that subsequently leads to fracture).

(FIG. 13).

Fewer process steps as a result of self-alignment (only one mask with an overmask); this results in:

Lower investment and ongoing expenditure,

Fewer possible sources of errors,

Deep doping gradients can be produced in very short periods of time.

e.g. 300 μm in depth in 20 min at 550°.

Consequently, deep drift fields are produced, and a directed flow of the charge carriers to the contacts is strongly enforced. The diffusion length increases, for example, by a factor of 3 or 10 in the case of a doping concentration gradient of one or two orders of magnitude [Weber97]. Consequently, the lifespan of the charge carriers would have to be prolonged approximately by one or two orders of magnitude.

Cz-material of lower quality (in particular material with a lot of oxygen) can be used, because the diffusion length is considerably increased as a result of the TD drift field. There is no need for magnetically-drawn mCz-silicon or expensive float-zone silicon.

Contacts can be spaced far apart (simple alignment)

Thicker wafers can be used.

Consequently the reflectivity of the back can be lower, and IR can be collected better.

(In the case of thin wafers good reflection with TCO on a-Si:H layers, see above)

Less wafer breakage

Thin wafers can be used.

Due to the outstanding surface recombination

Due to the very good reflection characteristics of the back

Metallization can be done away with.

Metal film as a cell connector is directly bonded onto the TCO layers with the use of conductive polymer bonding agents. The metal film has a comb-like structure that is congruent with the interdigitated contacts of the back-contact solar cell. (The contact film can also comprise an embossed pattern comprising undulating or meandering lines or comprising a waffle shape. This serves to reduce tensile stress caused by different thermal expansion coefficients of the contact strip and of the wafer.) See also FIG. 32 and FIG. 33.

No use of silver, multilayer systems [MulliganPAT06], or silver pastes. E.g. copper or aluminium foil are possible.

Advantages when compared to conventional HIT technology:

The side facing the light can be designed completely anew. The use of any desired antireflection coating (ARC) is now possible. There is no need for the ARC to be electrically conductive. Consequently this provides independence from:
  the transverse conductivity of the TCO. If the conductivity is insufficient, the TCO layer thickness has to be increased to above 80 nm (improved reflection), or the grid finger spacing has to be reduced (greater shading). Both lead to reductions in performance.
  the optical characteristics (no free carrier absorption in the TCO), therefore reduced absorption losses in the shortwave spectrum (see FIG. 9 in [Maruyama06]).
  the contact characteristics to the a-Si:H/TCO and TCO/metal contact. If the a-Si:H layers are too thin (e.g. less than 5 nm) this can lead to their depletion as a result of an excessive a-Si:H/TCO built-in potential, which results in a reduction in the open-circuit voltage and in the filling factor. This can only partly be compensated for by deposition of thicker a-Si:H layers (FIGS. 5a and 5b in [StanglO3]. In addition, increasing layer thicknesses cause absorption losses on the front.
  the refractive index of the TCO. In the case of highly conductive TCOs that at the same time are highly transparent in the optical spectral range, for example ZnO, ITO, the refractive index is hardly variable (n~1.9). With the use of dielectric ARCs, a double-layer ARC with reduced reflection and absorption becomes possible. In this way it is also possible to do without texturing the front in order to in this way minimise the interface defect density of the front.
  Moreover, multilayer ARCs that in particular provide very good optical characteristics and very good surface passivation become possible (e.g. a-Si:H/a-SiN:H, a-Si:H/SiO$_x$, SiO$_2$/a-SiN:H, a-SiC$_x$/SiC, a-SiC$_x$/a-SiN:H, ... ).

The contacts can be produced with the use of screen-printing.
  Emitter- and base contacts can be produced in one printing step.
  Less paste is required than in a complete back contact (as is common in conventional solar cells and also HIT solar cells).
  Only a low paste height is necessary, because the fingers can also be wider (no special pastes, double-printing or hot melt is required)

The aspect ratio plays a subordinate role (SANYO makes ~0.5. Commercially available low-temperature pastes only attain ~0.1).
  With conventional low-temperature screen printing directly onto ITO, low contact resistances of $R_c$=2-3 mΩ/cm$^2$ [Windgassen05] are attained. With new pastes, which were developed at RWTH-Aachen, $R_c$<0.1 mΩ/cm$^2$ are attained [Windgassen, oral communication August 2006].

Bus and gridfingers are done without
  No shading as a result of bus and gridfingers (shading in the case of SANYO ~7.6%-->~2.8 mA; ~50 fingers (2 mm spacing)×85 μm×10 cm~=4.25 cm$^2$ shading as a result of the grid+10 cm×2×~1.7 mm=3.4 cm$^2$ [Taguchi05]. Furthermore, the following advantages arise:

There is no need to develop screen-printing pastes with a high aspect ratio, low contact resistance and good conductivity, which pastes at the same time provide long-term stability and cure at low curing temperatures.

The curing conditions of the screen-printing pastes, as well as the sputtering process of the TCO (UV radiation and plasma damage) can have a negative effect on the pn-junction.
  If screen-printing pastes are used on the back, it is possible to use pastes with a poorer aspect ratio, contact resistance and specific conductivity (with lower costs, because development priorities can be set differently, e.g. long-term stability, handling etc.).
  Large wafers (e.g. 20 cm×20 cm) can be used without series resistance losses (bus, grid).

2.4.2 Other Considerations

The complete wafer surface is passivated (including the contacts). No passivation depressions resulting in high $J_0$ Very good passivation of the surfaces and edges is possible as a result of heterostructures and field effect
  It is also possible to passivate front and back differently, e.g. front with field effect (as is the case with SUNPOWER), back without field effect (no problems with contacts that penetrate inversion layers).

No shunting on inversion layers [Dauwe02]
  with the use of intrinsic a-Si:H, a-SiC$_x$, SiC$_x$, ... layers
  in cases where layers are to be used that result in inversion layers, the shunting effect will be less if a drift field (section 2.2.2) is used, because, due to the drift field, the contact region is depleted of minority charge carriers.

Bonded cell connectors are possible
  With the use of back-contact solar cells a more simple connection technique is possible.
  If TCO is deposited on the HIT contacts, the cell connectors can also be directly bonded on (metallization is then no longer necessary).
  The bonding spots are on the back of the solar cells and are thus protected from UV radiation, which gives them better long-term stability.
  The bonding areas of the cell connectors can be large, because they are on the back of the solar cell.

Polymer bonding agent provides a good contact with the TCO
  Consequently metallization can be done without.
  The cell connectors (e.g. copper foil) are bonded directly onto the TCO layer by means of conductive bonding agents [Scherff06b].

No perimeter losses
  Advantage in the case of low irradiation [Glunz02]
  Wafer edges are passivated all round (not only in the case of oxidised wafers).

If n-type substrate is used the hetero-pn-junction is less susceptible to interface defects [Stangl01]

No light-induced degradation
  if FZ- or n-type Cz-silicon wafers are used
  No degradation of the contacts as is the case with Cz-wafers with diffused boron emitters or boron-BSF High Phong exponents on the back are possible (more specular reflection) e.g. with a-SiC:H/SiN:H back [Hermle05]

If emitter and base are deposited onto a smooth (polished) surface, lower interface defects can be achieved.

Bifacial solar cells are possible with the use of a-Si:H/TCO/metal (narrow contacts) (see FIG. 31. The electrically conductive TCO layer (81) collects the current of the thin emitter contacts (72) and BSF (71) contacts, and conducts the current to the metal fingers (94 or 95). The back is largely transparent).

An expensive RCA process is reportedly not necessary according to [Maruyama06] and the University of Stuttgart [Jensen02]

Much hydrogen is in the wafer (after $H_2$ plasma to produce thermal donors).

The above can passivate defects during production of the drift field (atomic hydrogen diffuses very quickly; a lot more quickly than it takes to produce the TDs). Atomic hydrogen can also diffuse to the front where it can passivate the interface.

It is sufficient to deposit only nc-Si contacts without TCO as emitter and BSF heterocontacts.

This makes for simple processing.

Achieves good conductivity [Farrokh-Baroughi06]

No deflection of wafers with the use of bonded contacts in conjunction with meandering, waffle-shaped or wave-shaped cell connectors.

2.5 Additional Explanations Relating to the Claims

Relating to Claim 1

"Main Claim 1

A method and a device for producing local heterocontacts, characterised in that on surface-passivated semiconductor materials the surface-passivating layer of the semiconductor material, locally, is opened, by means of plasma etching, through the openings of a film that has been put in place, and the film that has been put in place subsequently serves as a mask for further deposition processes of heterocontacts, and/or further plasma processes."

When compared to methods that use photolithography, putting in place a film with local openings provides an advantage in that:

- the same film is used for the etching processes and for the optional hydrogen process and the deposition processes, and this film can remain on the sample during all the processes,
- there is no need to reposition the mask anew for each process,
- the sample is firmly clamped during transport and can thus not break as a result of oscillation during transport (many process steps are necessary in the production of a solar cell. For this purpose the solar cell is normally moved on conveyor belts or is resorted with the use of robots).

In contrast to masks that are put in place, putting the film in place provides an advantage in that the film is has been pressed flat against the surface, and in this way lateral etching/undercutting or deposition under the film is prevented.

The film is to be thin so that the openings are not deep as is the case in a thick mask, because this would reduce the deposition rate and have an influence on the deposition conditions.

Putting in place occurs in that the passivated semiconductor sample is placed on a curved area (e.g. a section of a cylinder jacket surface 3 m in diameter). Even to wafers that measure 350 µm in thickness this poses no problem. Since the wafer can only bend in the radius specified for it, no great local mechanical tension can occur in it. The stress is homogeneously distributed over the entire area. For all intents and purposes the wafer finds itself in a type of corset. Without this corset, any forces that act on the wafer result in parabolic deformation and thus in extreme local mechanical stress that subsequently leads to fracture. The wafer edges, which are parallel to the line of support, are then located somewhat in the air. After this the shadow film with the local openings, which film is located above and is tensioned by a force, is pushed parallel from the top onto the sample so that said sample bends onto the cylinder jacket surface. This ensures that the film over its entire area rests against the sample surface.

The film is to be designed so that it does not scratch the sample. For example, no burs resulting from the process of producing the openings should be present any longer. The sample is to be sufficiently flexible and elastic that uneven areas (impurities located on the sample, sawing faults, . . . ) of the sample can be compensated for without causing damage. The film can be produced from a soft material, e.g. aluminium or a polymer material, or the side of the film that is pressed onto the sample can be coated with said material. Furthermore, the film must be able to resist the etching processes used, and for this purpose can comprise an etching-resistant layer on the side subjected to the plasma. Depending on the etching process used, the correct material needs to be selected. For example $SiO_2$, SiN, or SiC may be considered for this.

In the context of claim 1 it is important that as far as possible there is no lateral etching/undercutting or deposition underneath the mask, and that the surface of the sample is not damaged.

Claim 2

"The device according to claim 1, characterised in that instead of the film that has been put in place a mask that has been put in place is used."

Instead of using the film it is also possible to use a mask. As described above, this mask can be coated with a soft layer on one side, or it can comprise a soft material so as not to damage the sample. On the other side, as described above, the mask can comprise a layer that is resistant to the required etching processes.

The mask remains in place as a result of its intrinsic weight, or it is pressed on in order to prevent lateral etching/undercutting.

In the context of claim two it is important that as far as possible no lateral etching/undercutting or deposition underneath the mask occurs, and that the surface of the sample is not damaged.

Claim 3

"The method according to the above-mentioned claims, characterised in that the film or mask that has been put in place, according to claim 1 or 2 is in place as snugly as possible in order to prevent lateral etching/undercutting or deposition underneath the mask."

The tensile strength of the film and the contact force which the film of claim 1 exerts on the sample, or the contact force of the mask of claim 2 are to be selected in such a way that lateral etching/undercutting is prevented and at the same time the sample surface is not damaged.

Claim 4

"The method according to the above-mentioned claims, characterised in that onto the first mask according to claim 1 or 2, which mask has been placed onto the surface-passivating layer, one or several further mask/s is/are placed or stretched, which mask/s covers/cover part of the openings of the first mask."

This is required if contacts that differ in their design are to be applied to the same sample side, for example in the exemplary embodiment of 3.2 of the back-contact solar cell (HIT-BACK). In this embodiment, emitter and base contact are both deposited onto the sample back. The first mask forms the base structure, wherein the second mask only exposes part of this structure. After completion of the process the second mask is removed and replaced by a third mask which in turn exposes other parts of the base structure. In this way partial regions of the sample, which regions are actually exposed by the base structure can be protected from processes relating to other contacts. In this way it is possible to hold the first mask in position while not doing without different contact types (p-type, n-type, metallization only, . . . ) on the same sample side. For example, back-contact solar cells with heterostructure contacts can be produced.

Claim 5

"The method according to the above-mentioned claims, characterised in that the surface-passivating layer comprises a material which in conjunction with the semiconductor substrate used comprises as low a surface recombination speed as possible."

The charge carrier recombination on the substrate surfaces is to be kept low by surface passivation. The surface recombination speed (SRS) at the interface is one measured variable. As a result of the layer design, the SRS should be less than 100 cm/second, or better still, less than 10 cm/second. To achieve this there are various options, mostly already known from the literature. Low SRSs are, for example, achieved by diffused and also by deposited $SiO_2$.

Consideration can also be given to layers deposited by means of various plasma-assisted CVD (also atmospheric pressure CVD) comprising amorphous (a-), nanocrystalline (na-), microcrystalline (μc-), epitactic (epi-) or related structures of silicon or germanium or silicon germanium, or of compounds of the aforementioned, with carbon, nitrogen, oxygen, sulphur or comparable elements of the groups of the periodic system, all also in hydrogenised form, as an intrinsic layer or a p-doped or n-doped layer. They achieve low SRSs. The following should be mentioned: a-Si:H, na-Si:H, a-SiN:H, a-SiC:H, SiC, a-SiO:H, μc-Si, . . . Also possible are layer stacks of the aforementioned, in any desired order. Achieving a low SRS is of importance in this sub-point, so as to avoid charge carrier recombination on the substrate surface. Low SRSs can also be achieved in conjunction with floating junctions or by re-treating the layers produced, e.g. by a forming-gas anneal or Alneal process.

Claim 6

"The method according to the above-mentioned claims, characterised in that the passivating layer on the solar cell front comprises a different material or a different material layer than does the back."

The surface-passivating layer can also serve as an antireflex layer, or can be part of a stack-shaped antireflex layer design. The refractive indices and layer thicknesses are to be adjusted accordingly, which is, for example, possible in the case of a-SiN:H.

On the other hand, local contacts in passivating layers that use the field effect can experience losses in the interface region surface passivation-contact [Dauwe02]. This may make it sensible not to use such layers on the contact side.

If, for example, back-contact solar cells are to be manufactured, it may be sensible to produce passivation on the front from a different material (stack) than the back comprising the contacts.

Claim 7

"The method according to the above-mentioned claims, characterised in that if at all possible only the surface-passivating layer is etched away, and in that location leaves no plasma residues and/or damage to the substrate material."

The plasma etching process is to be managed in such a way that as far as possible it is anisotropic and perpendicular to the mask surface. This can be influenced by process control [Lengtenberg95]. This will prevent etching underneath the mask, which would happen in isotropic etching. During the subsequent deposition process(es), under certain circumstances it is possible that no deposition takes place at the laterally etched/undercut positions, which results in loss of efficiency.

In anisotropic etching, sharp edges may be produced, which can lead to predetermined breaking points. In order to remove these edges, the anisotropic etching process can be followed by an isotropic etching process that rounds the edges and thus reduces the tendency to breakage.

Depending on the gas composition and the process control used, etching residues may remain on the etched surface, or they may damage the crystalline structure of the substrate, which can have a negative effect on the solar cell. These residues can be prevented by suitable process control, or they can be removed in one or several subsequent etching step/s that is/are matched to this.

Claim 8

"The method according to the above-mentioned claims, characterised in that the plasma etching process is selected in such a way that plasma residues of previous deposition processes are removed as well."

The smallest possible number of process chambers are to be used in the production of the solar cell. It is therefore advantageous if the etching process is selected such that the residues in the chambers, caused by a preceding deposition process, are removed as well. This etching process may comprise two or more sub-processes, wherein one of them etches the residues, while the next one etches the contact opening. This can be made possible by the selective etching behaviour of the plasma.

Claim 9

"The method according to the above-mentioned claims, characterised in that the deposited heterostructure contacts are designed in such a way that the highest possible solar cell efficiencies are achieved."

Heterocontacts are to be electrically superior to diffused contacts. This has, for example, been achieved by the HIT design of SANYO [Swanson05]. Their saturation current density at 18 fA/$cm^2$ is 40-times less than that of diffused contacts [Swanson05]. The heterocontacts are to be produced so that if at all possible these values or lower values are achieved. To this effect various layers or layer designs may be considered, which are, for example, described in the Sanyo patents, DE3732617A1, DE4010302A2, DE4025311, DE4027236, U.S. Pat. Nos. 5,213,628, 5,705,828, EP1113505, US20010008295, U.S. Pat. No. 6,670,542, JP2001189427, EP1187223A2, EP1300889A2, EP1320134, JP2003324209, US2003168578, JP002003258287 and US20030168660A1, which, however, only relate to layer designs over the entire area, wherein the emitter contacts or the base contacts either face the light-side or the side facing away from the light. These patents do not relate to local contacts, nor to back-contact solar cells in which both solar cell contacts are located on one sample side.

Other layers or layer designs that are easier to produce may also be considered, for example if the intrinsic buffer layer is done without [Schmidt06], if a base contact with ZnO is used [Rostan05] or if nanocrystalline silicon is used [Farrokh-B.06]. Many other designs are possible. All of them should result in the smallest possible losses that can have a negative effect on solar cell efficiency.

It is also possible to remove or compensate for the last impurities, as described in a SANYO patent in relation to entire areas, by means of a hydrogen plasma to which a dopant gas has been added or which only comprises a dopant gas.

Furthermore, it is possible, as described in a SANYO patent, to post-process the deposited layers with a hydrogen plasma, if need be with dopant gas.

Claim 10

"The method according to the above-mentioned claims, characterised in that the heterocontacts are prepared in such a way that they achieve good internal reflection."

If a TCO layer is deposited onto a heterocontact, very good internal reflection is achieved. Certain metals, for example Al, Cr, Ag, also produce very good internal reflection values. This is necessary in particular in the case of thin substrates (>250 µm) in order to minimise transmission losses. Furthermore, the local heterocontact areas can turn out to be larger than the diffused contacts, because they do not experience high recombination, which due to the larger area requires higher reflection factors in order to prevent such transmission losses.

Claim 11

"The method according to the above-mentioned claims, characterised in that the heterocontacts are transparent to light."

In the case of the SUNPOWER solar cell the contacts are on the back. Metallization covers almost the entire back. Light that comes from the back cannot penetrate the metallization.

If in the local heterocontacts at the top an electrically highly-conductive layer such as TCO or na-Si:H is used, metallization can be effected only on parts of this layer, with the remainder of the layer remaining transparent to light. In this way bifacial solar cells or bifacial back-contact solar cells can be produced. This also applies in conjunction with claim 14, in which no metal is applied, but instead the cell connector is bonded on directly. Thus, the cell connector will also only partially cover the contact.

Claim 12

"The method according to the above-mentioned claims, characterised in that as the last layer/s, one or several metal layer/s is/are applied to the heterocontacts."

If one or several metal layer/s is/are deposited onto the uppermost layer, this not only serves to improve the internal reflection but it can also serve as a contact area for cell connectors.

Claim 13

"The method according to the above-mentioned claims, characterised in that different TCO layers are applied to differently-doped heterocontacts (emitter- or base contact)."

TCOs are generally of the n-type. However, p-type TCOs are also known. N-type TCO in conjunction with p-type layers can lead to contact problems and thus to loss of efficiency. For this reason it may be sensible to deposit the corresponding TCOs separately onto p-type and n-type contacts.

Claim 14

"The method according to the above-mentioned claims, characterised in that the cell connectors are directly bonded to the TCO with the use of electrically conductive bonding agents."

If as the last layer a highly-conductive layer, e.g. TCO or na-Si:H, is deposited, the cell connectors can be bonded directly to the highly-conductive contact area by means of electrically conductive bonding agents. This provides an advantage in that soldering can be done without. As a rule, bonding takes place at lower temperatures than soldering. In particular in cases where no solders that contain lead must be used, the soldering temperature continues to increase. Excessive temperatures can damage the heterocontacts. Furthermore, soldering is associated with the danger of distorting and bending the wafer, which risk is reduced at lower bonding temperatures.

Claim 15

"The method according to the above-mentioned claims, characterised in that the bonded-on cell connectors are narrow along the heterocontacts and thus part of the TCO area is not covered and is transparent to light."

This applies as described in claim 11, except that no metal is applied, but instead the cell connector is bonded on directly. Thus, the cell connector will also only partially cover the contact.

Claim 16

"The method according to the above-mentioned claims, characterised in that the cell connectors are bent in a meandering manner or are embossed in a wave shape or a waffle shape."

In order to minimise distorting the bonded contacts, said contacts can be bonded-on in meandering lines. This additionally reduces distortions in the bonding process. Furthermore, the cell connectors can be embossed in a wave shape or a waffle shape (wherein the contact points with, for example, the TCO layer are located in the wave troughs or waffle troughs). If these embossed cell connectors are bonded on, this reduces distortion, and, furthermore, there is only little bonding agent underneath the small contact points with the TCO layer, which bonding agent is subjected to comparatively high local pressure, which results in very good contact because the metal particles contained in the polymer are very strongly pressed against each other.

Claim 17

"The method according to the above-mentioned claims, characterised in that after opening the surface passivation the region which later will be the contact region is subjected to a hydrogen plasma and at the same time is heated to a temperature of between 200° C. and 800° C., better still of between 300° C. and 600° C."

Following local opening of the surface passivation, the sample can be subjected to a hydrogen plasma in order to in this way in oxygen-rich silicon, e.g. Czochalski silicon, produce thermal donors.

Thermal donors can be produced in oxygen-rich silicon by means of hydrogen. If an oxygen-rich silicon sample, e.g. standard Czochalsky silicon (oxygen content of approximately $10^{18}$ cm$^{-3}$), is subjected to a hydrogen plasma, the hydrogen diffuses into the silicon. A hydrogen concentration gradient results. Along this gradient several oxygen atoms form to become donors (by annealing, for example at 450° C.; hence the name "thermal donors"). Doping takes place proportionally to the hydrogen concentration. In this way, depending on the hydrogen concentration, a doping gradient can be generated [Job98]. The maximum density of TD, depending on the oxygen concentration in the silicon, is approximately $3 \times 10^{16}$ cm$^{-3}$. This is sufficient for undoping p-type material. By means of this method e.g. a pn-junction can be produced (FIG. 2a in [Huang04]). At higher temperatures, for example at 550° C., within 20 min gradients can be generated that are 300 μm in depth.

Generating dopant gradients (also without pn-junction) results in a significantly improved collection probability of the minority charge carriers (FIG. 3 in Scherff06) because they are accelerated towards the contacts as soon as they are in the drift field (DF). In our own experiments, a doubling of the effective diffusion length has been observed with the application of the TD although, due to the hydrogen plasma treatment, damage on the back has occurred (the process used was not optimised for solar cells).

This method has already been proposed in [Ulyashin01], although not for local drift fields. Question: To what extent is the paper prejudicial as to novelty? To what extent could the method relating to the deep drift fields over the entire area be patented despite the publication by Ulyashin?

If hydrogen plasma treatment is carried out with the use of the mask described above, in this way local doping gradients (drift fields) similar to local BSFs (Back Surface Fields) could be produced, such as described for example in [Green98]. However, in the same period of time and at lower temperatures these BSFs can project considerably more deeply into the substrate. This then results in a significantly increased collection probability for the minority charge carriers, in particular for substrates whose diffusion length is large relative to the wafer thickness, because said charge carriers are accelerated towards the contacts as soon as they are located in the deep drift field. In back-contact solar cells the drift fields can act laterally from the emitter contacts to the base contacts. The influence that drift fields have on the efficiency of solar cells is investigated in [Cuevas97]. Even though the investigated cell structures differ from the structures described in the present document, it is evident that the diffusion length in the direction of the drift field is increased by a factor of 3 to 10 if there is a doping gradient of one or two orders of magnitude. In order to achieve the same effect with the use of a better silicon material, silicon with a tenfold or hundredfold minority carrier lifespan would need to be used.

Since by means of thermal donors at the most only $3 \cdot 10^{16}$ cm$^{-3}$ donors can be produced, and for a doping gradient of one to two orders of magnitude substrate doping is consequently around $3 \cdot 10^{15}$ cm$^3$ or $3 \cdot 10^{14}$, an additional BSF is needed in order to obtain a sufficiently high built-in potential and correspondingly high open-circuit voltages. In the examples of section 3 the highly-doped amorphous silicon layers of the back-contact form the BSF.

Claim 18

"The method according to the above-mentioned claims, characterised in that the hydrogen plasma is applied in a first step, and annealing takes place at a subsequent point in time of processing."

It may happen, for example, that the mask does not withstand the temperatures for diffusing the hydrogen, or that due to different thermal expansion coefficients said mask slides on the sample and damages it or slides out of its position. It can therefore be useful to separate the annealing process in time from the hydrogen plasma and to postpone it to a later point in time, e.g. after the masks have been removed, and to anneal only at this point in time.

Claim 19

"The method according to the above-mentioned claims, characterised in that any plasma damage to the substrate, which has been caused by the hydrogen plasma, is remedied by means of one or several plasma etching processes."

If the hydrogen plasma is too intensive or the temperature during the hydrogen plasma is too low, considerable crystal damage results on the treated contact points underneath the substrate surfaces. This crystal damage is to be repaired because otherwise increased recombination can occur in those locations.

However, in a generated doping gradient this recombination will be weaker than without, because in the damaged region the different charge carrier types have to a very large extent already been separated from each other by the electrical field.

Exemplary Embodiments 2.6 Solar Cell with Local Hetero-(HIT-) Back-contacts

Silicon solar cell on n-type wafer with local back-contacts and optional drift field that is produced by hydrogen-induced thermal donors.

| See Fig. no.: | Process | Comment |
|---|---|---|
| 5 | Production of pn-junction on silicon wafer: e.g.: P-emitter (11) on n-silicon (1) | Produce pn-junction by means of a diffusion process or CVD deposition (heterojunction) |
| 6 | Passivation of the wafer back (21): Deposition e.g. of intrinsic a-Si:H | As an alternative, other passivation layers can also be used: e.g. a-SiC:H, SiC, a-SiN:H or double layers such as a-Si:H/a-SiN:H, a-Si:H/a-SiC:H. If the process sequence is adapted, SiO$_2$ can also be used |
| 7 | Production of the back-contact (put masks in place): Place the mask 1 (41) for the local back-contacts or put the film in place | Placement of shadow film A bending radius of ~3 m poses no problem for a mono wafer 300 μm in thickness. Stretching the film over the generated surface of a cylinder ensures that the film rests flat over the entire area. |

-continued

| See Fig. no.: | Process | Comment |
|---|---|---|
| 8 | Production of the back-contact (etching): Locally open the passivation layer (plasma etching (51)) | Depending on the passivation layer used, the etching parameters and process gases have to be selected in such a way that as little plasma damage and etching residue as possible remain. |
| 9 | Production of the back-contact Optional (Production of a drift field (6)): As a result of hydrogen plasma (61) at e.g. 450° C., thermal donors (62) arise and produce a deep drift field | If silicon with short minority charge carrier diffusion lengths is used, drift fields, caused by doping gradients of e.g. one order of magnitude, increase the diffusion length by a factor of three, thus increasing the quantum yield of the solar cell. |
| 10 | Production of the back-contact (plasma deposition): Deposit local back-contact (71) | The design of the back-contact can comprise only one doped layer or several layers (intrinsic, doped, amorphous, nanocrystalline, microcrystalline). In [Rostan05] an (i) a-Si:H I (p) a-Si:H I (p+) a-Si:H I ZnO:Al layer design is described (however, as a layer over the entire area, on p-silicon, which layer forms a very good back-contact. |
| 11 | Production of the contact areas Optional (sputtering-on TCO): Sputtering-on of TCO layer (81) | TCO increases the internal reflection and ensures low-ohmic contact to low-temperature screen-printing pastes. As an alternative, cell connectors can also be bonded directly onto the TCO with the use of conductive polymer bonding agents. |
| 12 | Preparation of the back-contact (metal contact (91) over the entire area): Deposit back-contact | The back-contact over the entire area can be produced by vapour depositing, sputtering, or low-temperature screen-printing. |
| 13 | Preparation of the back-contact (local metal contact (92)): Deposit back-contact | Depending on the solar cell- and module design it may be sensible not to deposit the back-contact over the entire area (saving of materials, increased internal reflection, bifacial solar cells). |
| 14 | Preparation of the back-contact (remove mask (41): | |

2.6.1 Possible Modifications and Simplifications

Below, possible modifications of the work steps described in section 2.6 are listed: In relation to no.:

1.: The time-consuming wet-chemical cleansing process, which is also associated with considerable materials expenditure, and the time-consuming diffusion process can be replaced by in-situ plasma cleansing in conjunction with plasma deposition [Tucci01].

2.: The time-consuming wet-chemical cleansing process, which is also associated with considerable materials expenditure, and time-consuming thermal oxidation can be replaced by in-situ plasma cleansing in conjunction with passivation by plasma deposition of a well passivating layer, e.g. $SiC_x$ [Glunz06] or a-Si:H, SiN:H, a-SiC:H or comparable layers.

5a.: With the use of wafers with very long minority-carrier lifespans (float zone silicon or high-grade Czochalski silicon) it is possible to do without process step 5a.

5b.: If the doped layer has low defect density, it is also possible to do without the (i) a-Si:H layer [Schmidt06].

5b.: Since TCOs are usually of the n-type, it is possible to do without the highly doped (n) µc-Si:H layer without obtaining high contact resistance at the (n) a-Si:H/TCO.

5b.: Very recently, p-type TCOs have become known. With the use of these TCOs, it is possible to do without the highly-doped (p)µc-Si:H layer without obtaining high contact resistance at the (p)a-Si:H/TCO.

2.7 Process Relating to a HIT-BACK Solar Cell

Described is an exemplary embodiment to produce a HIT-BACK solar cell (back-contact solar cell with hetero (HIT) contacts). In this embodiment plasma processes are used exclusively. The starting point is provided by an untreated sawn Cz-wafer in standard quality ($L_b$=10 µs). Ideally, the processes take place in atmospheric-pressure CVD facilities (AP-CVD). This type of CVD facility provides an advantage in that no vacuum chambers or pumping systems are required (cost savings during investment and maintenance). Furthermore, there are no evacuation times. Less downtime is probable (no pumps, no leaks in the vacuum system). It has been proven in [Imai06, Heintze06, Matsumoto03] that with these facilities it is also possible to achieve outstanding results.

| See Fig. no.: | Process | Comment |
|---|---|---|
| 15 | Untreated n-type Cz wafer (1) (sawn) | Economical mono-silicon wafer (in future possibly drawn from economical PV-grade silicon) |
| 16 | Substrate cleansing: Plasma-etching of the saw damage (52), and texturing of the front (53) ($SF_6 + O_2$) [Schnell00] | (100)-mono Si wafer, etched with $SF_6$ in AP-CVD [Heinze06] |
| 17 | Passivation of the wafer front: Deposit passivation (21) by means of a plasma process e.g. 30 nm | [Imai06] (surface recombination speeds of 100 cm/sec have been attained) If the wafer is free, i.e. exposed (e.g. on a heated carrier), deposition also takes place at the wafer edges and passivates them. |
| 18 | Double-layer ARC First layer (31) with refractive index n~2.3 Second layer (32) with refractive index n~1.5 e.g. a-SiN:H | |
| 19 | Substrate cleansing: Plasma etching of the saw damage (52) on the back | [Heinze06] |
| 20 | Passivation of the wafer back: Deposit passivation (22) by means of a plasma process e.g. [Imai06] e.g. 30 nm | [Imai06] |
| 21 | Production of the base contact (BSF) (Placement of masks): Place the original mask 1 (42) + place the mask 2 (43) for the base contact | |
| 22 | Production of the base contact (BSF) (Etching): Locally open passivation (22) (plasma etching (51)) | [Legtenberg95] |
| 23 | Production of the drift field (6) (Place hydrogen): Hydrogen plasma (61) at | [Job98] and refs 1, 2 and 3 therein |

-continued

| See Fig. no.: | Process | Comment |
|---|---|---|
| | 450° C. A gradient of thermal donors (62) arises and produces a deep drift field (6) | |
| 24 | Production of the base contact (71) (BSF) (Plasma deposition): Deposition of back-contact 2. (n) a-Si:H BSF-layer | The back contact can also comprise a layer design, as in the HIT solar cell by SANYO, with an intrinsic buffer layer (i)a-Si:H/(n)a-Si:H or (i)a-Si:H/(n)a-Si:H/(n⁺)μc-Si with a highly-doped microcrystalline silicon layer. |
| 25 | Production of the emitter contact (pn-junction) (Place masks): Remove mask 2 (43) for the base contact + Remove mask 3 (44) for the emitter | |
| 26 | Production of the emitter contact (pn-junction) (Plasma deposition): Locally open passivation (21) (Plasma etching (51)) | [Legtenberg95] |
| 27 | Production of the emitter contact (pn-junction) Deposit the emitter contact (p) a-Si:H emitter layer (72) | |
| 28 | Emitter contact completed Remove mask 3 (44) for the emitter | Both contact areas are open and can be processed at the same time. |
| 29 | Production of the contact areas Optional (Sputter TCO (81) on): Sputter TCO layer on | The TCO (81) forms the contact and acts as an antireflex layer. Subsequently, metals can be applied to the TCO (81), or cell connectors can be bonded on directly. Depending on the cell design, it is also possible to do without the TCO. |
| 30 | Finished solar cell | Depending on the passivation layer (22) used, the back of the HIT-BACK solar cell is completely transparent. |
| 31 | Bifacial solar cell | Narrow metallization can be applied. By vapour depositing, screen-printing [Windgassen05] (as on the emitter contact on the left-hand side in the illustration (95)), or by bonding-on thin wires (as on the base contact on the right-hand side in the illustration (94)). |
| 32 | HIT-BACK solar cell with bonded-on cell connectors (93) | Cell connectors can be bonded directly onto the TCO (81) layers. |
| 33 | HIT-BACK solar cells connected by means of bonded-on cell connector (93) | As a result of bonding, metallization (95) or (94) is no longer necessary. |

LITERATURE

[Breitenstein06] O. Breitenstein, P. Alternatt, K. Ramspeck, M A Green, Jianhua Zhao und A Schenk, Interpretation of the Commonly Observed I-V Characteristics of c-Si Cells Having Ideality Factor Larger than Two, Proc. 4th WCPEC, Hawaii, 879-884, (2006).

[Dauwe02] S. Dauwe, L. Mittelstädt, A Metz, und R. Hetzei, Experimental Evidence of Parasitic Shunting in Silicon Nitride Rear Surface Passivated Solar cells, Prog. Photovolt: Res. Appl., 10, 271 (2002).

[Farrokh-B.06] M. Farrokh Baroughi und S. Sivoththaman, A Novel Si-based Heterojunction Solar Cell without Transparent Conductive Oxide, Proc. 4th WCPEC, Hawaii, 83-86, (2006).

[Goetzberger03] A Goetzberger, C. Hebling und H.-W Schock, Photovoltaic materials, history, status and outlook, Mater. Sei. Eng. R 40, 1 (2003).

[Glunz02] S. W Glunz, J. Dicker, M. Esterle, M. Hermle, J. Isenberg, F. J. Kamerewerd, u. A, High-Efficiency Silicon Solar Cells for Low-Illumination Applications, Proc. 29th PVSC, New Orleans, 450, (2002).

[Glunz04] S. Glunz, E. Schneiderlöchner, D. Kray, A Grohe, M. Hermle, H. Kampwerth, R. Preu und G. Willecke, Laser-Fired Contact Silicon Solar Cells on p- and n-Substrates, Proc. 19th Europ. PVSEC, Paris, (2004)

[Glunz06] S. W Glunz, S. Janz, M. Hofmann, T. Roth und G. Willeke, Surface Passivation of Silicon Solar Cells using Amorphous Silicon Carbide Layers, Proc. 4th WCPEC, Hawaii, 1016-1019, (2006).

[Green98] M. Green, J. Zhao, A Wang, 23% Module and other Silicon Solar Cell Advances, Proc. 2nd WCPEC, Wien, 1187, (1998)

[Heintze06] M. Heintze, AHauser, R. Möller, H. Wanka, E. L6pez, I. Dani, V. Hopfe, J. W Müller, A Huwe, In-Line Plasma Etching at Atmospheric Pressure for Edge Isolation in Crystalline Si Solar Cells, Proc. 4th WCPEC, Hawaii, 1119-1121, (2006),

[Huang04] Y. L. Huang, Y. Ma, R. Job, A G. Ulyashin, Hydrogen diffusion at moderate temperatures in p-type Czochralski silicon, Journal of Applied Physics 96 (12), 7080-7086, (2004),

[Huang05] Y. L. Huang, Y. Ma, R. Job, M. Scherff, W R. Fahrner, H. G. Shi, D. S. Xue and M.-L. Davidc, Silicon Pyramidal Texture Formed in Pure Hydrogen Plasma Exposure, Journal of The Electrochemical Society, 152 (9), C600-C604, (2005).

[lmai06] R. Imai, T Ishiwata, H Sai, N Yamamoto, K Arafune, Y Ohshita and M Yamaguchi, Surface Passivation of crystalline Silicon Solar Cells by Atmospheric Pressure chemical Vapour Deposition, Proc. 4th WCPEC, Hawaii, (2006).

[Jansen95] H. Jansen, M. de Boer, R. Legtenberg und M. Elwenspoek, The Black Silicon Method:, J. Micromech. Microeng. (5), 115 (1995).

[Jensen02b] N. Jensen, Heterostruktursolarzellen aus amorphem und krisallinem Silicium, Dissertation, (Shaker Verlag GmbH, Aachen, 2002).

[Jin06] H. Jin, K. J. Weber und AW Blakers, Depassivation of Si—SiO2 Interface Following Rapide Thermal Annealing, Proc. 4th WCPEC, Hawaii, 1078-1080, (2006).

[Jin06b] H. Jin, K. J. Weber und A W Blakers, The Effect of a Post Oxidation In-situ Nitrogen Anneal on Si Surface Passivation, Proc. 4th WCPEC, Hawaii, 1071-1073, (2006).

[Job98] R. Job, W R. Fahrner, N. M. Kazuchits, AG. Ulyashin, A Two Step Low-Temperature Process for a p-n Junction Formation due to Hydrogen enhanced Thermal Donor Formation in p-Type Cz Silicon, MRS 513, 337, (1998).

[Legtenberg95] R. Legtenberg, H. Jansen, M. de Boer und M Elwenspoek, Anisotropie Reactive Ion Etching of Silicon Using SF6/02/CHF3 Gas Mixtures, J. Electrochem. Soc., 142, 2020 (1995)

[Lim98] S.-H. Lim, J.-W Park, H.-K. Yuh und E. Yoon, Dry Cleaning of Fluorocarbon Residuals by Low-Power Electron Cyclotron Resonance Hydrogen Plasma, Journal of the Korean Physical Society, (33), 108, (1998),

[Maruyama06] E. Maruyama, A Terakawa, M. Taguchi, Y. Yoshimine, D. Ide, T. Baba, M. Shima, H. Sakata und M. Tanaka, Sanyo's Challenges to Development of High-efficiency HIT Solar Cells and Expansion of HIT Business, Proc. 4th WCPEC, Hawaii, 1455-1460, (2006).

[Matsumoto03] M. Matsumoto, M. Shima, s. Okamoto, K. Murata2, M. Tanaka, s. Kiyama, H. Kakiuchi, K. Yasutake, K. Yoshii, K. Endo und Y. Mori, Extremely High-Rate Deposition of Silicon Thin Films Prepared By Atmospheric Plasma CVD Methode with a Rotary Electrode, Proc. 3rd WCPEC, Osaka, 50-A3-03, (2003).

[Mulligan04] W Mulligan, D. Rose, M. Cudzinovic, D. DeCeuster, K. McIntosh, D. Smith, and R. Swanson. Manufacture of Solar Cells with 21% Efficiency, Proc. 19th Europ. PVSEC, Paris, (2004).

[Plagwitz05] H. Plagwitz, M. Schaper, A. Wolf, R. Meyer, J. Schmidt, B. Terheiden und R. Brendel, 20%-Efficient silicon Solar Cells with Local Contacts to the a-Si-Passivated Surfaces by means of Annealing (COSIMA), Proc. 20th Europ. PVSEC, Barcelona, 725 (2005).

[Sopori06] B. Sopori, R. Reedy, K. Jones, L. Gedvilas, B. Keyes, Y. Yan, M. AlJassim, V. Yulundur und A. Rohatgi, Damage-Layer-Mediated H Diffusion During Si: H Processing: A Comprehensive Model, Proc. 4th WCPEC, Hawaii, 1028-1031, (2006).

[Scherff06] M. L D. Scherff S. Schwertheim, Y. Ma, 1. Mueller, W R. Fahrner, 10×10 cm2 HIT Solar Cells Contacted with Lead-Free Electrical Conductive Adhesives to Solar Cell Interconnectors, Proc. 4th WCPEC, Hawaii, 1384-1387, (2006).

[Scherff06a] M. L D. Scherff and Y. Ma and W Dungen. and 1. Mueller and W R. Fahrner, Increased efficiencies in a-Si:H(n)/cz-Si(p) heterojunction solar cells due to gradient doping by thermal donors, 21th Europ. PVSEC, Dresden, 1178-1180 (2006).

[Scherff06b] M. L D. Scherff, H. Stiebig, S. Schwertheim und W R. Fahrner, Double Layer Antireflection Coating of Heterojunction Solar Cells, 21th Europ. PVSEC, Dresden, 1392-95, (2006).

[Schmidt06] M. Schmidt, H. Angermann, E. Conrad, L. Korte, A. Laades, K. v. Maydell, Ch. Schubert und R. Stangl, Physical and Technological Aspects of a-Si:H/c-Si Hetero-Junction Solar Cells, Proc. 4th WCPEC, Hawaii, 1433-1438, (2006).

[SchneIIOO] M. Schnell, R. Ludemann und S. Schaefer, PLASMA SURFACE TEXTURIZATION FOR MULTI-CRYSTALLINE SILICON SOLAR CELLS, Proc. 28th PVSC, Ankorage, 367 (2000).

[SP-220 06] Data sheet Sunpower SPR-220 www.sunpowercorp.com (Juni 2006).

[Stangl01] R. Stangl, A. Froitzheim, L. Eistner und W Fuhs, Amorphous/chrystalline silicon heterojunction solar cells, a simulation study, Proc. 17th Europ. PVSEC, München, 1387-1390, (2003).

[Stangl03] R. Stangl, A. Froitzheim, M. Schmidt und W Fuhs, Design Criteria for Amorphous/Crystalline Silicon Heterojunction Solar Cells,—A Simulation Study, Proc. 3rd WCPEC, Osaka, 4P-A8-45, (2003).

[Swanson05] R. Swanson, Approaching the 29% Limit Efficiency of silicon Solar Cells, Proc. 31th PVSC, Colorado Springs, 889 (2005).

[Taguchi05] M. Taguchi, H. Sakata, Y. Yoshimine, E. Maruyama, A. Terakawa and M. Tanaka, An Approche for the higher Efficiency in the HIT Cells, Proc. 31th PVSC, Colorado Springs, 866 (2005).

[Tucci01] M. Tucci, R. De Rosa und F. Roca, CF4/OZ Dry Etching of Textured Crystalline Silicon Surface in a-Si:H/ c-Si Heterojunction for Photovoltaic Applications, Sol. Energy Mater. Sol. Cells, 69, 175 (2001).

[Ulyashin01] A. Ulyashin, R. Job, M. Scherff, W R. Fahrner,: Low-temperature drift field performance in the base region of crystalline silicon solar cells by hydrogen enhanced thermal donor formatation, 17th European PVSEC, München, 1379 (2001).

[van Wiering.56] A. Van Wieringen and N. Warmholtz, Physica, 22, 849 (1956).

[Windgassen05] H. Windgassen, M. Scherff, A. Nositschka, H. Kurz und W R. Fahrner, Large Area (n) a-Si:H/(p)c-Si Heterojunction Solar Cells with Low Temperature Screen Printed Contacts, Proc. 20th Europ. PVSEC, Barcelona, 954 (2005).

[Wieringen56] A. Van Wieringen und N. Warmholtz, Physica 22, 849 (1956).

[Weber97] K. J. Weber, A. Cuevas und A. W Blakers, The Influence of Drift Fields in Thin Silicon Solar Cells, Sol. Energy Mater. Sol. Cells, 45, 151 (1997).

[ZhangOO] D. ZHANG, Promotionsschrift: Surface reaction Mechanisms in Plasma Etching Processes, University of Illinois at Urbana-Champaign, Urbana, Ill., 2000.

The invention claimed is:

1. A method for producing local heterocontacts, wherein on a surface-passivated semiconductor material, a surface-passivating layer of the semiconductor material, locally, is opened, by means of plasma etching, through an opening of a first covering that has been put in place, and the first covering that has been put in place subsequently serves as a mask for depositing the heterocontacts.

2. The method according to claim 1, wherein first covering that has been put in place subsequently serves as a mask for further deposition processes of transparent conductive oxide (TCO), metals and/or further plasma processes.

3. The method according to claim 1, wherein the first covering that has been put in place is in place as snugly as possible in order to prevent lateral etching/undercutting or deposition underneath the first covering.

4. The method according to claim 1, wherein the first covering has been placed onto the surface-passivating layer, and onto said first covering at least one second covering is placed or stretched, which covers part of the opening of the first covering.

5. The method according to claim 1, wherein the surface-passivating layer comprises a material which in conjunction with the semiconductor material used comprises as low a surface recombination speed as possible.

6. The method according to claim 1, wherein the surface-passivating layer is disposed on a front surface of the semiconductor material and comprises a different material or a different material layer than a back surface of the semiconductor material.

7. The method according to claim 1, wherein only the surface-passivating layer is etched away, and in that location leaves no plasma residues and/or damage to the semiconductor material.

8. The method according to claim 1, wherein the plasma etching process is selected in such a way that plasma residues of previous deposition processes are removed as well.

9. The method according to claim 1, wherein the deposited heterocontacts are designed in such a way that the highest possible solar cell efficiencies are achieved.

10. The method according to claim 1, wherein the heterocontacts are prepared in such a way that they achieve good internal reflection.

11. The method according to claim 1, wherein the heterocontacts are transparent to light.

12. The method according to claim 1, wherein one or more metal layers are applied to the heterocontacts.

13. The method according to claim 2, wherein different TCO layers are applied to differently-doped heterocontacts (emitter or base contact).

14. The method according to claim 2, wherein one or more cell connectors are directly bonded to the TCO with the use of electrically conductive bonding agents.

15. The method according to claim 14, wherein the bonded-on cell connectors are narrow along the heterocontacts and thus part of the TCO area is not covered and is transparent to light.

16. The method according to claim 14, wherein the cell connectors are bent in a meandering manner or are embossed in a wave shape or a waffle shape.

17. The method according to claim 1, wherein after opening the surface passivation layer, a region which later will be a contact region is subjected to a hydrogen plasma and at the same time is heated to a temperature of between 200° C. and 800° C.

18. The method according to claim 1, wherein hydrogen plasma is applied in a first step, and annealing takes place at a subsequent point in time of processing.

19. The method according to claim 18, wherein any plasma damage to the semiconductor material, which has been caused by the hydrogen plasma, is remedied by means of one or several plasma etching processes.

20. The method according to claim 1, wherein the first covering is a film.

* * * * *